(12) United States Patent
Ching et al.

(10) Patent No.: US 9,911,824 B2
(45) Date of Patent: Mar. 6, 2018

(54) SEMICONDUCTOR STRUCTURE WITH MULTI SPACER

(71) Applicant: TAIWAN SEMICONDUCTOR MANUFACTURING CO., LTD, Hsinchu (TW)

(72) Inventors: Kuo-Cheng Ching, Zhubei (TW); Ching-Wei Tsai, Hsinchu (TW); Chih-Hao Wang, Baoshan Township (TW); Ying-Keung Leung, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/858,862

(22) Filed: Sep. 18, 2015

(65) Prior Publication Data

US 2017/0084714 A1 Mar. 23, 2017

(51) Int. Cl.
*H01L 27/088* (2006.01)
*H01L 29/66* (2006.01)
*H01L 29/78* (2006.01)
*H01L 27/11* (2006.01)
*H01L 27/02* (2006.01)

(52) U.S. Cl.
CPC ...... *H01L 29/6656* (2013.01); *H01L 29/6681* (2013.01); *H01L 29/66545* (2013.01); *H01L 29/785* (2013.01); *H01L 27/0207* (2013.01); *H01L 27/0248* (2013.01); *H01L 27/1104* (2013.01); *H01L 29/66795* (2013.01)

(58) Field of Classification Search
CPC . H01L 21/386; H01L 29/785; H01L 29/4238; H01L 29/66795; H01L 29/785257; H01L 29/0696; H01L 27/0207; H01L 27/0248; H01L 21/823431
USPC ... 257/401, 368, 386, 347, E21.409, E21.19, 257/E21.573; 438/284, 286, 249, 479, 438/585
See application file for complete search history.

(56) References Cited

U.S. PATENT DOCUMENTS

| 8,637,384 | B2 | 1/2014 | Ando et al. | |
| 9,064,948 | B2* | 6/2015 | Cai | H01L 29/66545 |
| 9,190,486 | B2* | 11/2015 | Xie | H01L 29/66545 |
| 9,337,094 | B1* | 5/2016 | Pranatharthiharan | |
| | | | | H01L 21/76897 |
| 9,443,956 | B2* | 9/2016 | Yu | H01L 29/785 |
| 2002/0163036 | A1* | 11/2002 | Miura | H01L 21/28114 |
| | | | | 257/336 |
| 2009/0001480 | A1* | 1/2009 | Cheng | H01L 29/42368 |
| | | | | 257/387 |
| 2010/0155776 | A1 | 6/2010 | Lee | |
| 2011/0121398 | A1* | 5/2011 | Hoentschel | H01L 21/26513 |
| | | | | 257/369 |

(Continued)

*Primary Examiner* — Thinh T Nguyen
(74) *Attorney, Agent, or Firm* — Birch, Stewart, Kolasch & Birch, LLP

(57) ABSTRACT

A semiconductor structure and a method for forming the same are provided. The semiconductor structure includes a fin structure formed over a substrate and a gate structure formed across the fin structure. The semiconductor structure further includes a bottom spacer formed on a lower part of a sidewall of the gate structure and an upper spacer formed on an upper part of the sidewall of the gate structure. In addition, the upper spacer includes an air gap formed in a dielectric material.

20 Claims, 24 Drawing Sheets

(56) References Cited

U.S. PATENT DOCUMENTS

| | | | |
|---|---|---|---|
| 2014/0110798 A1* | 4/2014 | Cai | H01L 29/78 257/410 |
| 2014/0264491 A1 | 9/2014 | Huang et al. | |
| 2015/0091089 A1* | 4/2015 | Niebojewski | H01L 29/0843 257/347 |
| 2015/0263122 A1* | 9/2015 | Hsiao | H01L 29/6656 438/283 |
| 2016/0163816 A1* | 6/2016 | Yu | H01L 29/6656 438/283 |
| 2016/0181143 A1* | 6/2016 | Kwon | H01L 27/10814 438/586 |
| 2016/0225667 A1* | 8/2016 | Zang | H01L 29/4991 |

* cited by examiner

US 9,911,824 B2

SEMICONDUCTOR STRUCTURE WITH MULTI SPACER

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in computers is the upper levels of integration of circuits. This is accomplished by miniaturizing or shrinking device sizes on a given chip. However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
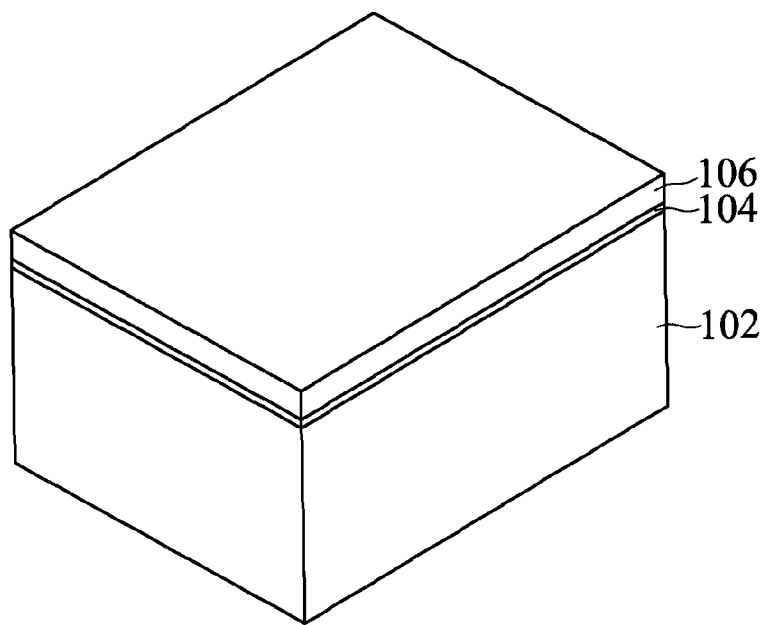
FIGS. 1A to 1Q are perspective views of various stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided. The semiconductor structure may include a gate structure, a bottom spacer formed at the lower part of the sidewall of the gate structure, and an upper spacer formed at the upper part of the sidewall of the gate structure. In addition, the upper spacer includes an air gap inside, so the dielectric constant can be relatively low.

FIGS. 1A to 1S are perspective views of various stages of forming a semiconductor structure 100a in accordance with some embodiments. As shown in FIG. 1A, a substrate 102 is received in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, conductive features, and/or isolation structures. Furthermore, substrate 102 may further include single or multiple material layers to be patterned. For example, the material layers may include a silicon layer, a dielectric layer, and/or a doped poly-silicon layer.

A dielectric layer 104 is formed over substrate 102, and a hard mask layer 106 formed over dielectric layer 104, as shown in FIG. 1A in accordance with some embodiments. Dielectric layer 104 may be used as an adhesion layer between substrate 102 and mask layer 106. In addition, dielectric layer 104 may also be used as an etch stop layer for etching mask layer 106. In some embodiments, dielectric layer 104 is made of silicon oxide. Dielectric layer 104 may be formed by using a thermal oxidation process, although other deposition processes may be used in some other embodiments.

Mask layer 106 may be used as a hard mask during subsequent photolithography processes. In some embodiments, mask layer 106 is made of silicon nitride. Mask layer 106 may be formed by using low-pressure chemical vapor deposition (LPCVD) or plasma enhanced chemical vapor deposition (PECVD), although other deposition processes may also be used in some other embodiments.

Figure 1B:
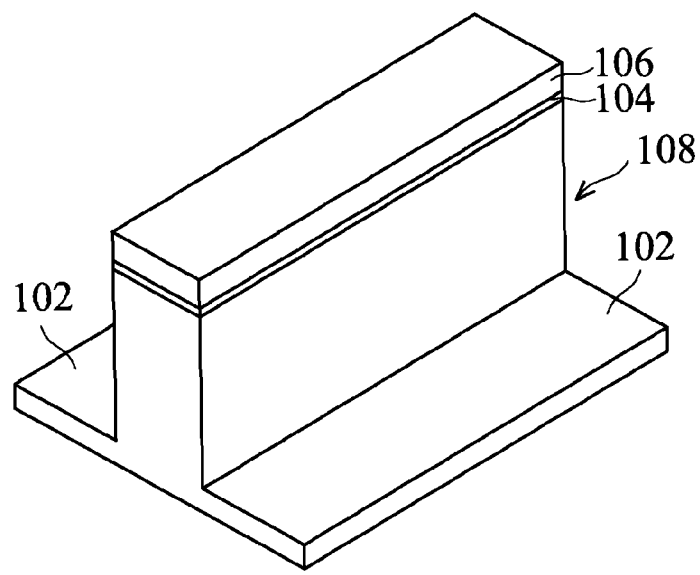

Next, a fin structure 108 is formed by patterning mask layer 106, dielectric layer 104, and substrate 102, as shown in FIG. 1B in accordance with some embodiments. In some embodiments, fin structure 108 is formed by forming a photoresist layer over mask layer 106 and sequentially etching mask layer 106, dielectric layer 104, and substrate 102.

Figure 1C:
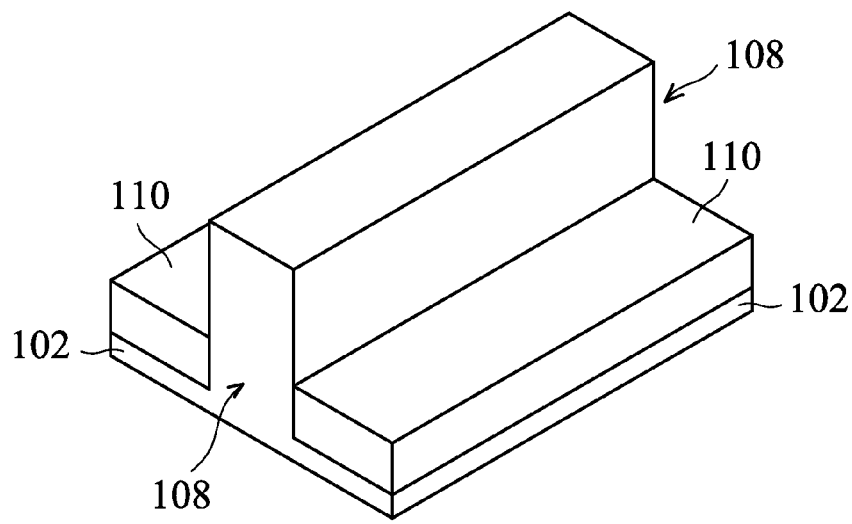

Afterwards, an isolation structure 110 is formed over substrate 102, and fin structure 108 is surrounded by isolation structure 110, as shown in FIG. 1C in accordance with some embodiments. In addition, dielectric layer 104 and mask layer 106 are removed. Isolation structure 110 may be formed by depositing an insulating layer over substrate 102 and recessing the insulating layer. In some embodiments, isolation structure 110 is made of silicon oxide, silicon nitride, silicon oxynitride, fluoride-doped silicate glass (FSG), or other low-K dielectric materials.

Figure 1D:
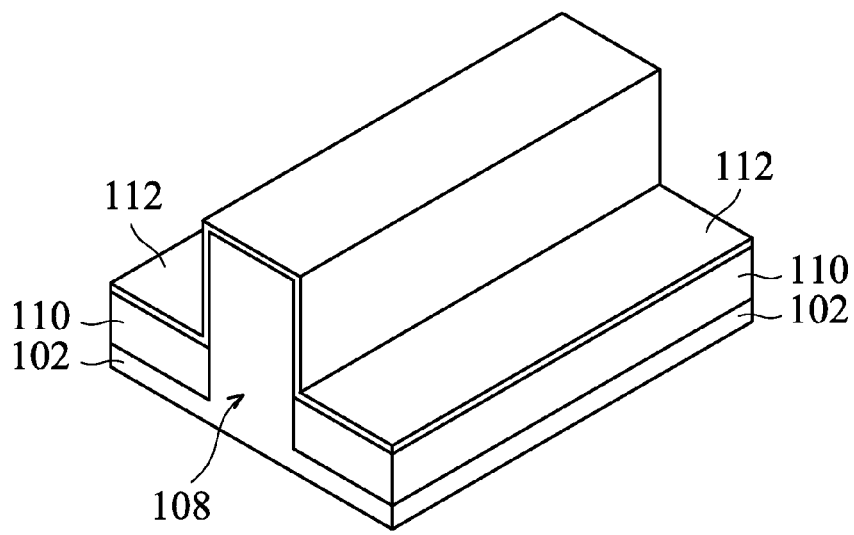

Next, a gate dielectric layer 112 is formed over substrate 102 to cover fin structure 108 and isolation structure 110, as shown in FIG. 1D in accordance with some embodiments. In some embodiments, gate dielectric layer 112 is a dummy gate dielectric layer. In some embodiments, gate dielectric layer 112 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

Figure 1E:
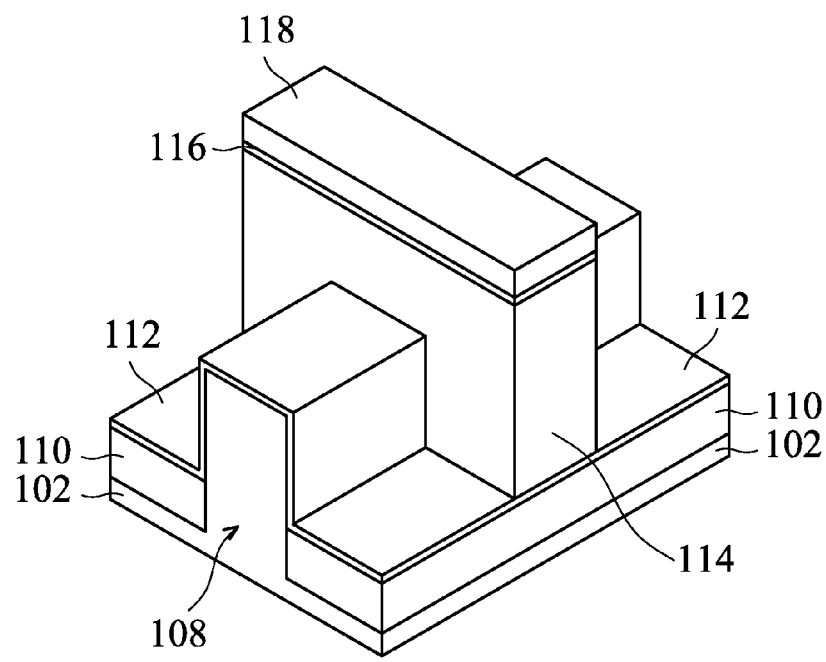

Afterwards, a dummy gate structure 114 is formed across fin structure 108 and extends over isolation structure 110, as shown in FIG. 1E in accordance with some embodiments. In some embodiments, dummy gate structure 114 is made of polysilicon. In some embodiments, a dielectric layer 116 and a mask layer 118 are positioned over dummy gate structure 114. Materials and methods used to form dielectric layer 116 and mask layer 118 may be similar to those used to made dielectric layer 104 and mask layer 106 and are not repeated herein.

Figure 1F:
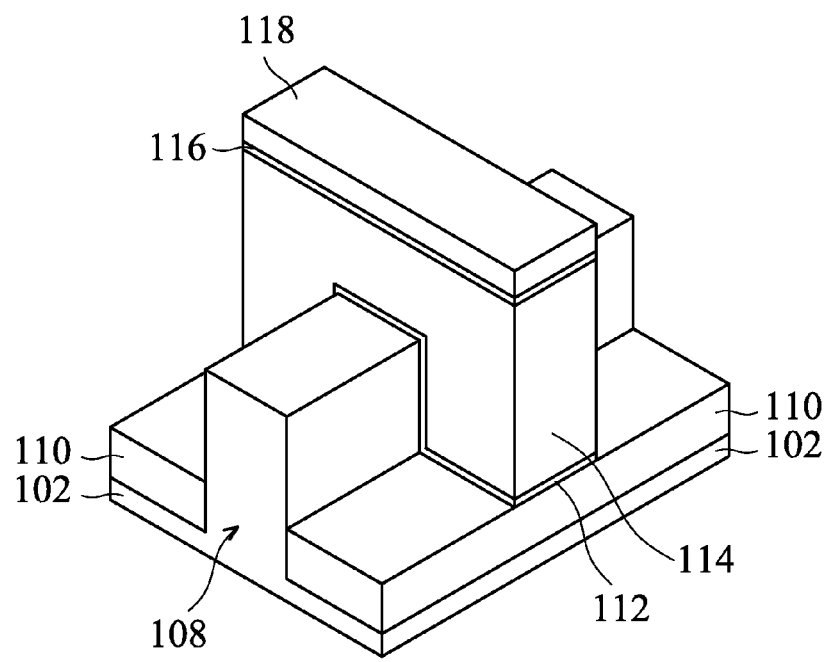
Figure 1G:
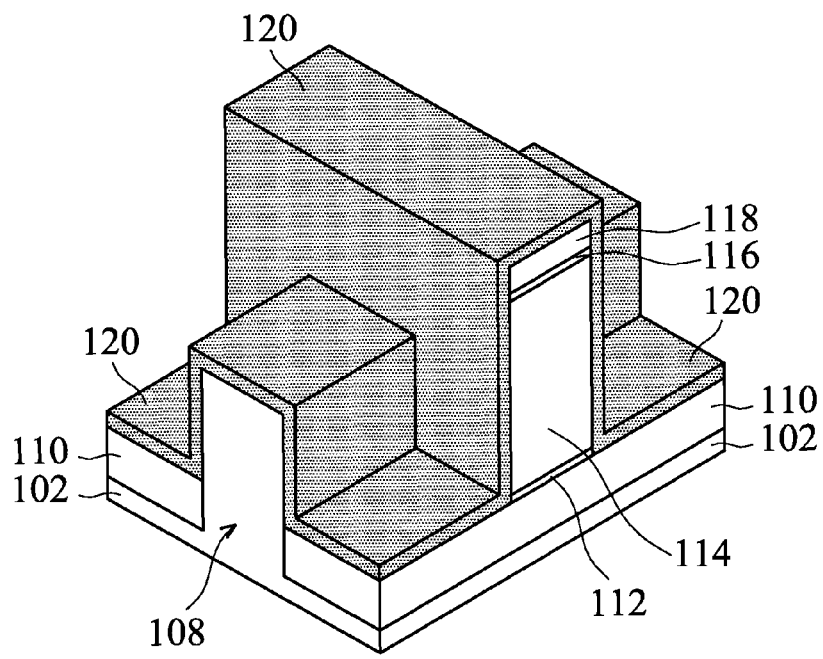

Next, the portions of gate dielectric layer 112 which are not covered by dummy gate structure 114 are removed, as shown in FIG. 1F in accordance with some embodiments. Afterwards, a first spacer layer 120 is formed over substrate 102, as shown in FIG. 1G in accordance with some embodiments. More specifically, first spacer layer 120 covers the sidewalls of dummy gate structure 114, the top surface of isolation structure 110, and the sidewalls and the top surface of fin structure 108. In some embodiments, first spacer layer 120 is made of silicon oxycarbide (SiOC), silicon oxycarbonnitride (SiOCN), silicon nitride, silicon oxide, silicon oxynitride, silicon carbide, or other applicable dielectric materials. In some embodiments, the thickness of first spacer layer 120 is in a range from about 4 nm to about 12 nm.

Figure 1H:
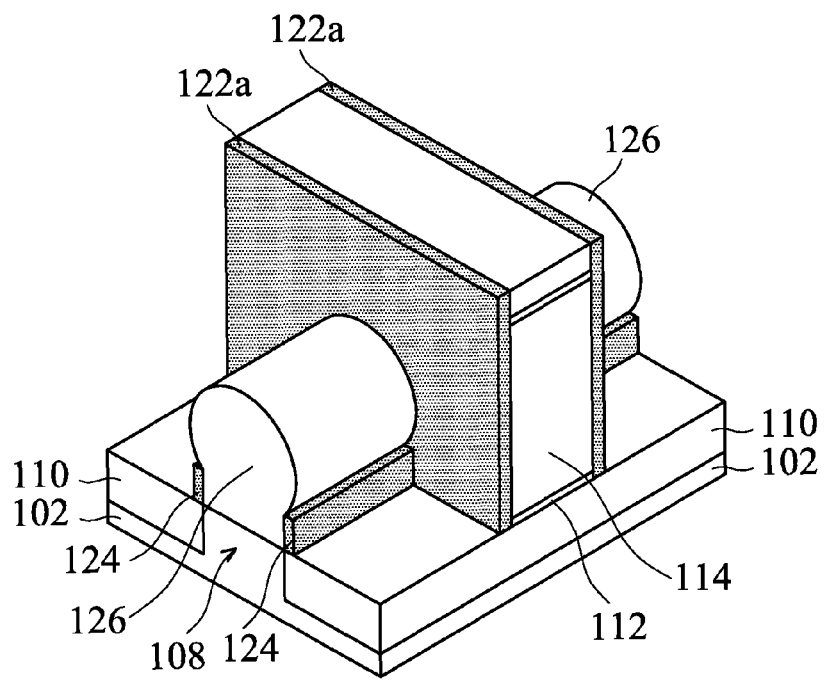

After first spacer layer 120 is formed, an etching process is performed to form gate spacers 122a on the sidewalls of dummy gate structure 114 and to form fin spacers 124 on the sidewalls of fin structure 108, as shown in FIG. 1H in accordance with some embodiments. The etching process may be a wet etching process. As described previously, gate spacer 122a may be made of silicon oxycarbide (SiOC) or silicon oxycarbonnitride (SiOCN), and the thickness of gate spacer 122a may be in a range from about 4 nm to about 12 nm.

After gate spacers 122a and fin spacers 124 are formed, source/drain structures 126 are formed in fin structure 108, as shown in FIG. 1H in accordance with some embodiments. Source/drain structures 126 may be formed by recessing fin structure 108 to form recesses and growing a strain material in the recesses. In some embodiments, the strained material is grown by performing an epitaxial (epi) process. In addition, the lattice constant of the strained material may be different from the lattice constant of substrate 102. In some embodiments, source/drain structures 126 include Ge, SiGe, InAs, InGaAs, InSb, GaAs, GaSb, InAlP, InP, or the like.

Figure 1I:
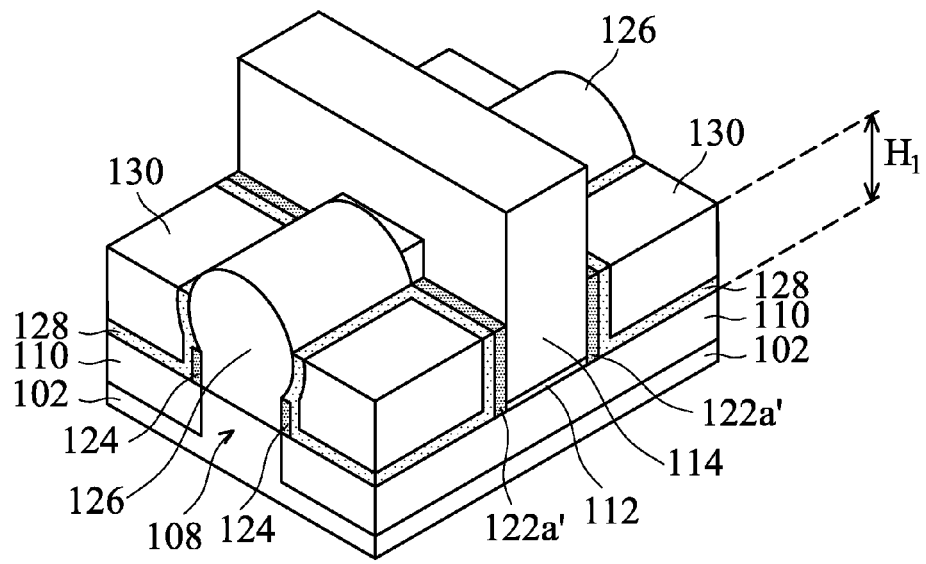

After source/drain structures 126 are formed, a contact etch stop layer (CESL) 128 and a bottom anti-reflective coating (BARC) layer 130 are formed over substrate 102, and etching back processes are performed to etch bottom anti-reflective coating layer 130, contact etch stop layer (CESL) 128, and first spacer layer 122a, as shown in FIG. 1I in accordance with some embodiments. In addition, mask layer 118 and dielectric layer 116 are removed.

More specifically, contact etch stop layer 128 is formed to cover source/drain structures 126, isolation structure 110, and dummy gate structure 114 in accordance with some embodiments. In some embodiments, contact etch stop layer 136 is made of silicon nitride, silicon oxynitride, and/or other applicable materials. Contact etch stop layer 136 may be formed by plasma enhanced CVD, low pressure CVD, ALD, or other applicable processes.

After contact etch stop layer 128 is formed, bottom anti-reflective coating layer 130 is formed over contact etch stop layer. In some embodiments, bottom anti-reflective coating layer 130 is a photoresist layer. In some embodiments, bottom anti-reflective coating layer 130 is made of amorphous carbon. Bottom anti-reflective coating layer 130 may be formed by spin coating, although other coating processes may alternatively be used.

Next, an etching-back process is performed to etch bottom anti-reflective coating layer 130 to a determined height. After bottom anti-reflective coating layer 130 is etched back, another etching-back process is performed to etch the portions of contact etch stop layer 128 and gate spacer 122a that are not covered by bottom anti-reflective coating layer 130, as shown in FIG. 1I in accordance with some embodiments.

During the etching-back process, gate spacer 122a is etched to form a bottom spacer 122a' at the lower part of the sidewall of dummy gate structure 114, as shown in FIG. 1I. The height of the bottom spacer 122a' may be determined by the height of bottom anti-reflective coating layer 130. In some embodiments, the height of the bottom spacer 122a' is substantially equal to the height of bottom anti-reflective coating layer 130. In some embodiments, bottom spacer 122a' has a height $H_1$ in a range from about 20 nm to about 60 nm. The height of bottom spacer 122a' may affect the performance of the resulting semiconductor structure, and the related details will be described later. In some embodiments, bottom spacer 122a' has a thickness in a range from about 4 nm to about 12 nm. In addition, as shown in FIG. 1I, some portions of source/drain structure 126 and fin structure 108 are also exposed after the etched back process is performed.

Figure 1J:
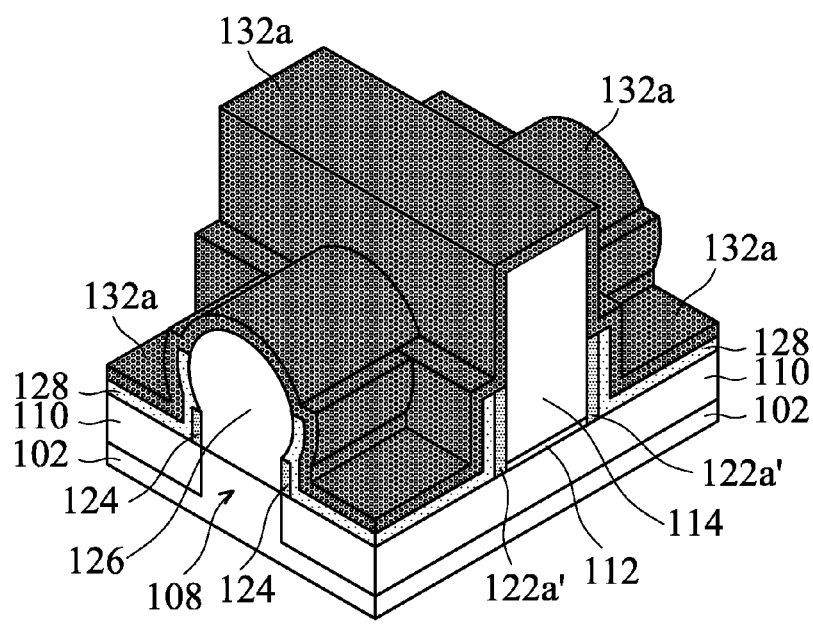

After gate spacer 122a is etched to form bottom spacer 122a', bottom anti-reflective coating layer 130 is removed, and a dummy spacer layer 132a is formed over substrate 102, as shown in FIG. 1J in accordance with some embodiments. Dummy spacer layer 132a is formed over contact etch stop layer 128 and also covers the top surface and the upper part of the sidewalls of dummy gate structure 114 that is not covered by bottom spacer 122a'.

In some embodiments, dummy spacer layer 132a and bottom spacer 122a' are made of different materials. In some embodiments, the materials used to form dummy spacer layer 132a and bottom spacer 122a' are chosen to have great etching selectivity in the subsequent etching process. In some embodiments, dummy spacer layer 132a is made of a high-k dielectric material. In some embodiments, dummy spacer layer 132a is made of aluminium oxide ($Al_2O_3$), aluminum oxynitride (AlON), or SiN. In some embodiments, dummy spacer layer 132a has a thickness in a range from about 4 nm to about 12 nm.

Figure 1K:
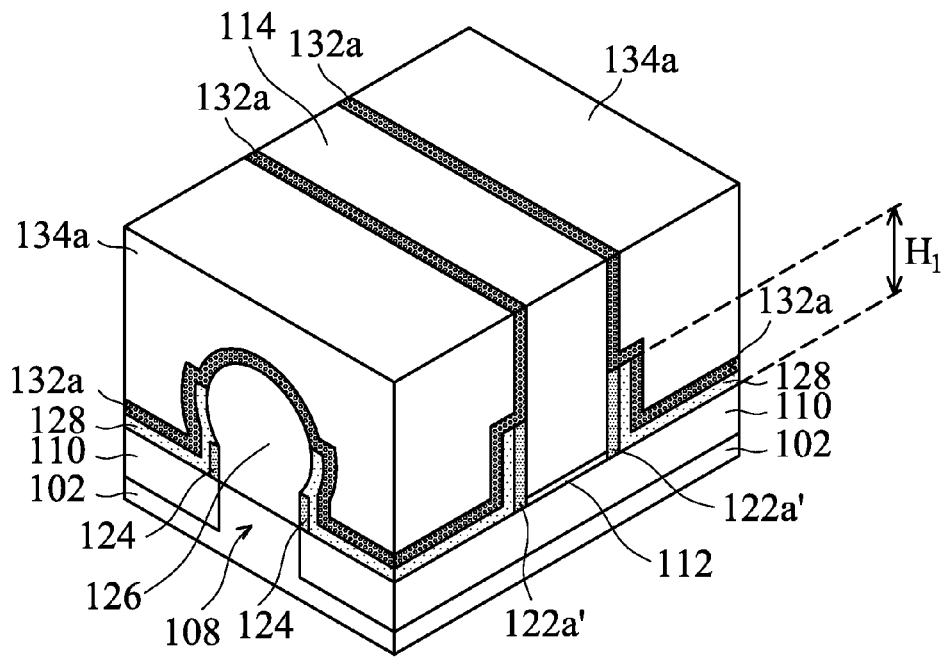

After dummy spacer layer 132a is formed, an interlayer dielectric (ILD) layer 134a is formed over dummy spacer layer 132a, as shown in FIG. 1K in accordance with some embodiments. Interlayer dielectric layer 134a may include multilayers made of multiple dielectric materials, such as silicon oxide, silicon nitride, silicon oxynitride, and/or other applicable low-k dielectric materials. Interlayer dielectric layer 134a may be formed by chemical vapor deposition (CVD), physical vapor deposition, (PVD), atomic layer deposition (ALD), spin-on coating, or other applicable processes.

After interlayer dielectric layer 134a is formed, a polishing process is performed to remove some portions of interlayer dielectric layer 134a and dummy spacer layer 132a until the top surface of dummy gate structure 114 is exposed, as shown in FIG. 1K in accordance with some embodiments. In some embodiments, a chemical mechanical polishing (CMP) process is performed.

Figure 1L:
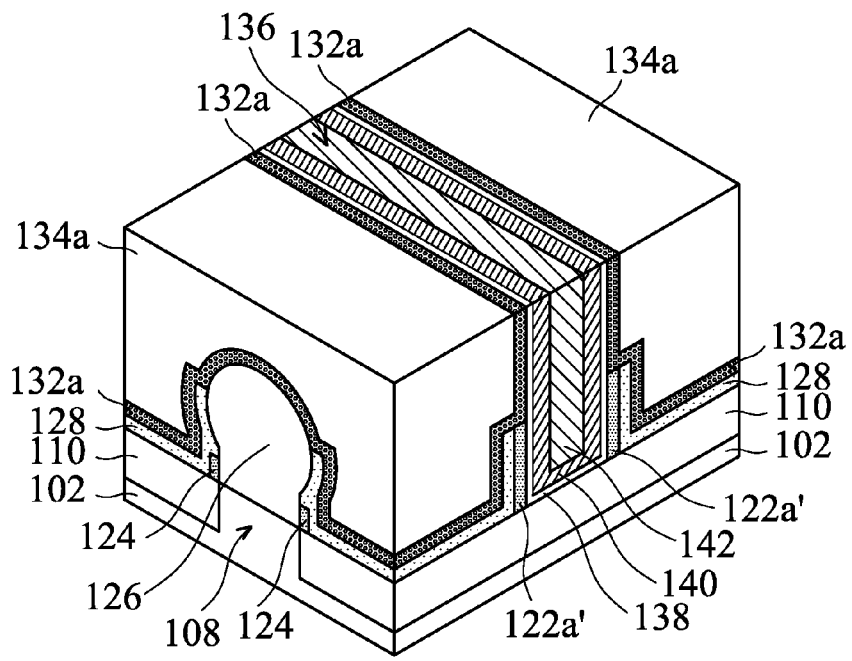

As shown in FIG. 1K, the lower part of the sidewall of dummy gate structure 114 is covered by bottom spacer 122a', and the upper part of the sidewall of dummy gate structure 114 is covered by dummy spacer layer 132a. Next, dummy gate structure 114 is replaced by a gate structure 136, as shown in FIG. 1L in accordance with some embodiments. Gate structure 136 may be formed by removing dummy gate structure 114 and gate dielectric layer 112 to form a trench and forming gate structure 136 in the trench. It should be noted that, although gate dielectric layer 112 is removed in FIG. 1L, it may not be removed in some other embodiments.

In some embodiments, gate structure 136 includes a gate dielectric layer 138, a work function metal layer 140, and a gate electrode layer 142. In some embodiments, gate dielectric layer 138 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

Work function metal layer 140 is formed over gate dielectric layer 138 in accordance with some embodiments. Work function metal layer 140 is customized to have the proper work function. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

Gate electrode layer 142 is formed over work function metal layer 140 in accordance with some embodiments. In some embodiments, gate electrode layer 142 is made of a conductive material, such as aluminum, copper, tungsten, titanium, tantulum, or other applicable materials. Gate dielectric layer 138, work function metal layer 140, and gate electrode layer 142 may be formed by any applicable process to any applicable thickness.

It should be noted that additional layers may be formed above and/or below gate dielectric layer 138, work function metal layer 140, and gate electrode layer 142, such as liner layers, interface layers, seed layers, adhesion layers, barrier layers, or the like. In addition, gate dielectric layer 138, work function metal layer 140, and gate electrode layer 142 may include more than one layer made of various materials.

Figure 1M:
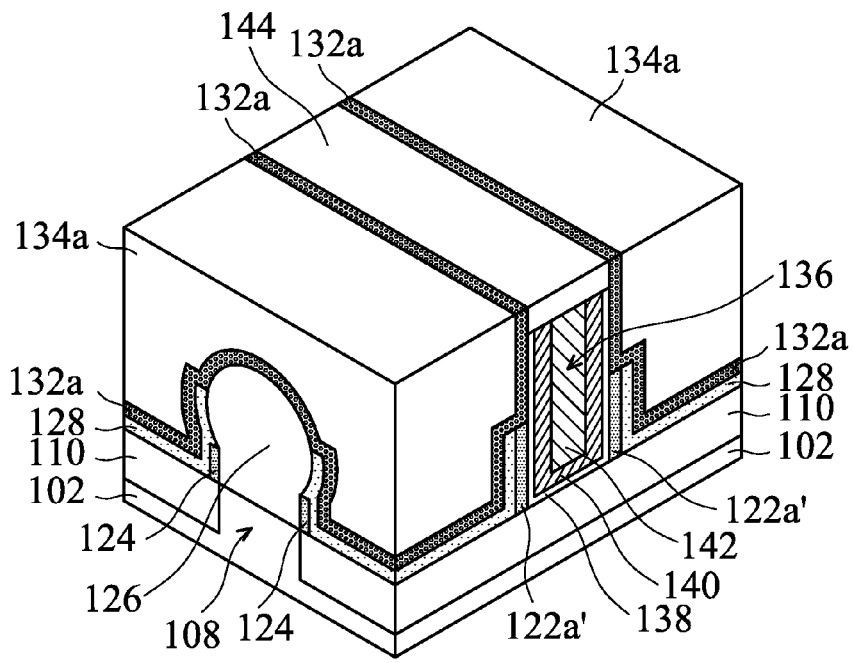

Next, the top portion of gate structure 136 is removed to form a recess, and a gate hard mask layer 144 is formed in the recess, as shown in FIG. 1M in accordance with some embodiments. In some embodiments, gate hard mask layer 144 and dummy spacer layer 132a are made of different materials. In some embodiments, the materials used to form gate hard mask layer 144 and dummy spacer layer 132a are chosen to have etching selectivity in the subsequent etching process. In some embodiments, gate hard mask layer 144 is made of silicon oxide, silicon nitride, silicon oxynitride, and/or other applicable low-k dielectric materials. In some embodiments, gate hard mask layer 144 has a thickness in a range from about 5 nm to about 20 nm.

Figure 1N:
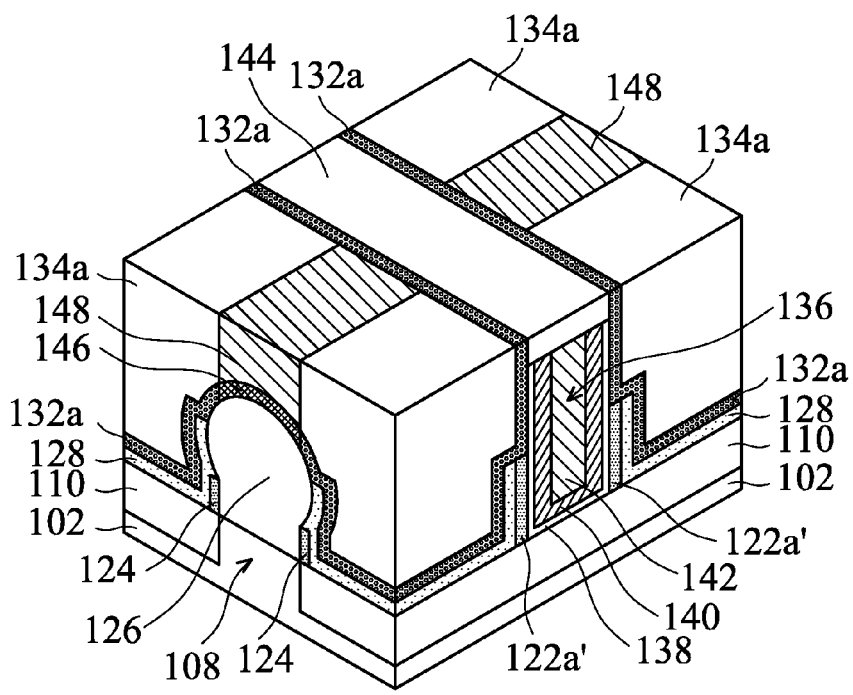

Afterwards, a silicide layer 146 and a contact 148 are formed through interlayer dielectric layer 134a to connect with source/drain structure 126, as shown in FIG. 1N in accordance with some embodiments. More specifically, a trench may be formed through interlayer dielectric layer 134a to expose source/drain structure 126, and silicide layer 146 is formed on the exposed portion of source/drain structure 126. After silicide layer 146 is formed, contact 148 is formed over silicide layer 146, such that the trench is filled with contact 148.

In some embodiments, contact 148 includes aluminum (Al), copper (Cu), tungsten (W), titanium (Ti), tantalum (Ta), titanium nitride (TiN), tantalum nitride (TaN), nickel silicide (NiS), cobalt silicide (CoSi), tantalum carbide (TaC), tantulum silicide nitride (TaSiN), tantalum carbide nitride (TaCN), titanium aluminide (TiAl), titanium aluminum nitride (TiAlN), other applicable conductive materials, or a combination thereof. In some embodiments, contact 148 includes a titanium nitride layer and tungsten formed over the titanium nitride layer.

In addition, contact 148 may include a liner and/or a barrier layer. For example, a liner (not shown) may be formed on the sidewalls and bottom of the contact trench. The liner may be made of silicon nitride, although any other applicable dielectric may alternatively be used. The liner may be formed using a plasma enhanced chemical vapor deposition (PECVD) process, although other applicable processes, such as physical vapor deposition or a thermal process, may alternatively be used. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

Figure 1O:
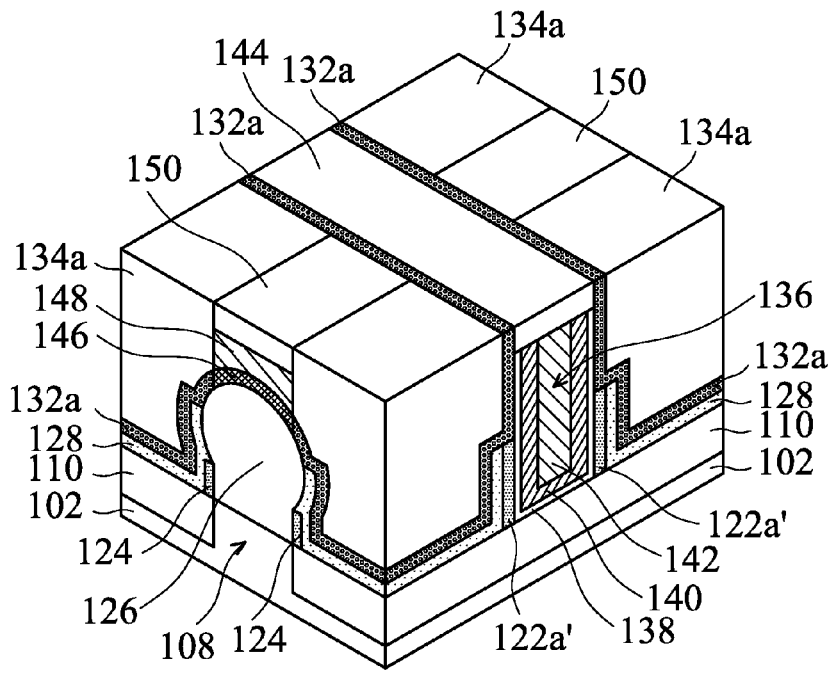

Next, the top portion of contact 148 is removed to form a recess, and a contact hard mask layer 150 is formed in the recess, as shown in FIG. 1O in accordance with some embodiments. In some embodiments, contact hard mask layer 150, dummy spacer layer 132*a*, and gate hard mask layer 144 are made of different materials. In some embodiments, the materials used to form contact hard mask layer 150, dummy spacer layer 132*a*, and gate hard mask layer 144 are chosen to have etching selectivity in the subsequent etching process. In some embodiments, contact hard mask layer 150 is made of silicon oxide, silicon nitride, silicon oxynitride, and/or other applicable low-k dielectric materials. In some embodiments, contact hard mask layer 150 has a thickness in a range from about 5 nm to about 20 nm.

Figure 1P:
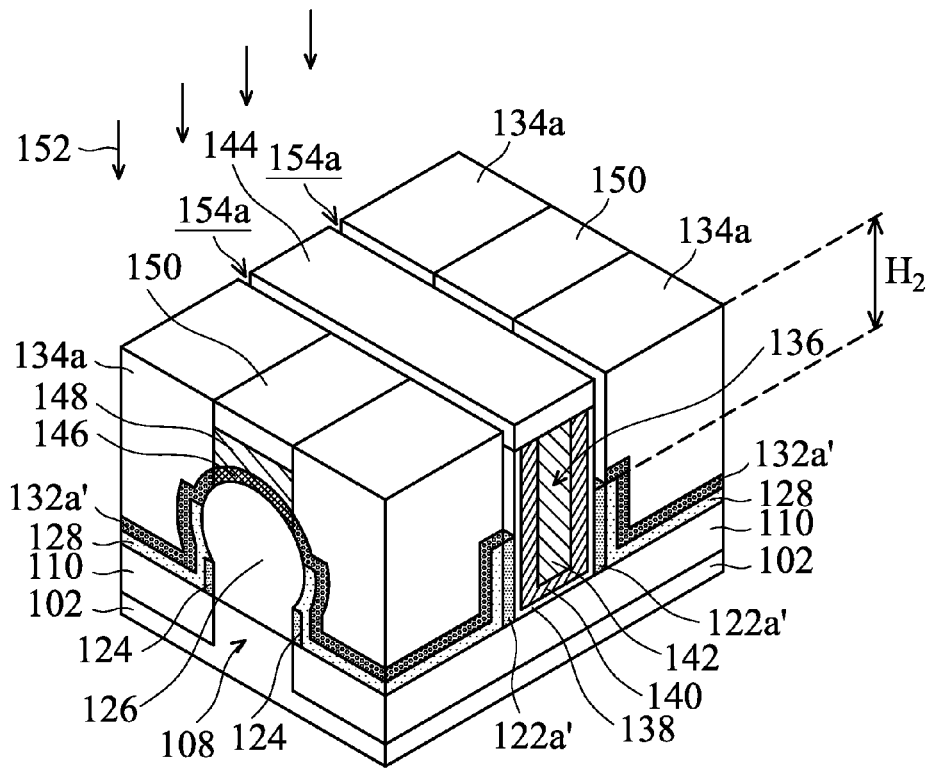

After contact 148 and contact hard mask layer 150 are formed, an etching process 152 is performed to remove the portion of dummy spacer layer 132*a* formed on the upper part of the sidewall of gate structure 136, as shown in FIG. 1P in accordance with some embodiments. In some embodiments, etching process 152 is a wet etching process.

As shown in FIG. 1P, after etching process 152 is performed, an etched dummy spacer layer 132*a*' remains locating on contact etch stop layer 128. In addition, a gap 154*a* is formed between gate structure 136 and interlayer dielectric layer 134*a* in accordance with some embodiments. In some embodiments, the height of gap 154*a* has a height $H_2$ in a range from about 20 nm to about 60 nm. Height $H_2$ of gap 154*a* is determined by height $H_1$ of bottom spacer 122*a*', and the performance of the semiconductor structure may be affected by the heights $H_1$ and $H_2$ (Details will be described later).

In addition, the upper part of the sidewall of gate structure 136, which is originally covered by dummy spacer layer 132*a*, is now exposed by gap 154*a*. Furthermore, as described previously, since the material used to form bottom spacer 122*a*' is chosen to be different from that is used to form dummy spacer layer 132*a*, bottom spacer 122*a*' is not removed during etching process 152. As shown in FIG. 1P, the top surface of bottom spacer 122*a*' is exposed by gap 154*a*.

Figure 1Q:
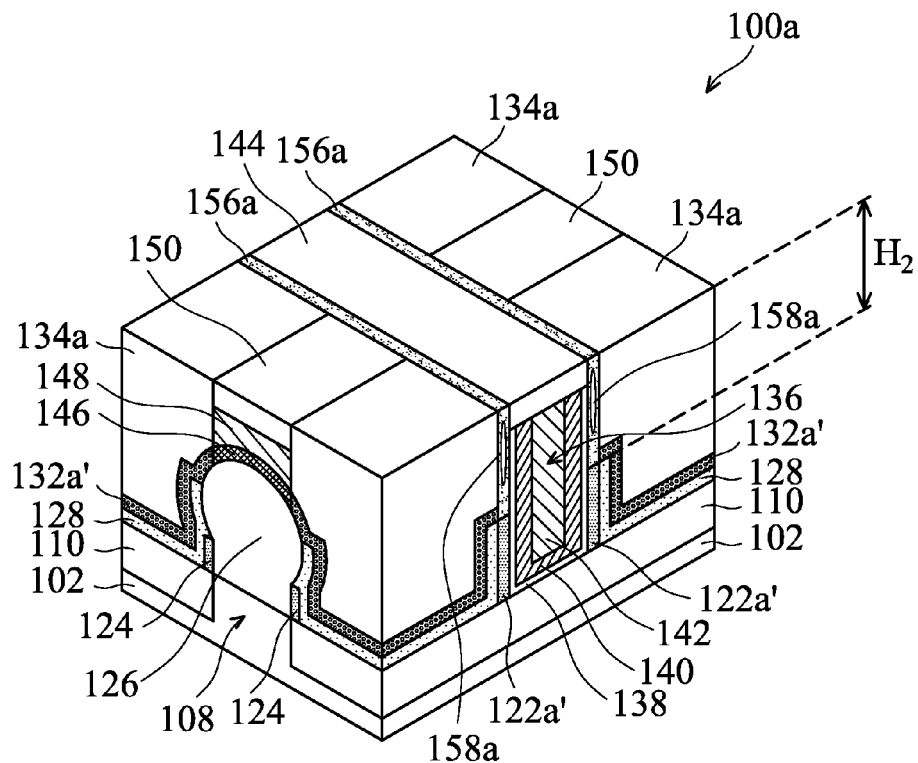

After the portion of dummy spacer layer 132*a* formed on the upper part of the sidewall of gate structure 136 is removed, an upper spacer 156*a* is formed in gap 154*a*, as shown in FIG. 1Q in accordance with some embodiments. In some embodiments, upper spacer 156*a* is formed by depositing a dielectric material in gap 154*a*. Since gap 154*a* is relatively thin, when the dielectric material is deposited in gap 154*a*, an air gap 158*a* may be formed in the dielectric material in accordance with some embodiments. Upper spacer 156*a* having air gap 158*a* can have a relatively low dielectric constant, and therefore the performance of the resulting semiconductor structure 100*a* may be improved.

As shown in FIG. 1Q, a portion of upper spacer 156*a* is positioned between interlayer dielectric layer 134*a* and the upper part the sidewall of gate structure 136 in accordance with some embodiments. In addition, a portion of upper spacer 156*a* is positioned between contact 148 and the upper part of the sidewall of gate structure 136 in accordance with some embodiments.

In some embodiments, upper spacer 156*a* has a thickness in a range from about 6 nm to about 15 nm. As described previously, upper spacer 156*a* is formed in gap 154*a*, which is formed by etching a portion of dummy spacer layer 132*a*. During the etching process, a little amount of interlayer dielectric layer 134*a* is also removed, and therefore upper spacer 156*a* is thicker than dummy spacer layer 132*a* in accordance with some embodiments. In some embodiments, upper spacer 156*a* is thicker than bottom spacer 122*a*'.

In some embodiments, upper spacer 156*a* has a height that is substantially equal to height $H_2$, which is in a range from about 20 nm to about 60 nm. As described previously, upper spacer 156*a* includes air gap 158*a* formed in the dielectric material, and therefore the dielectric constant of upper spacer 156*a* can be relatively low. Therefore, the height of upper spacer 156*a* may be adjusted according to the desired dielectric constant. However, if upper spacer 156*a* is too high, it may be difficult to fully remove the dummy spacer layer 132*a* formed on the upper part of the sidewall of gate structure 136, and the performance of the resulting semiconductor structure may be undermined. On the other hand, if upper spacer 156*a* is too low, there may not have air gap 158*a* formed therein or the air gap 158*a* may not be large enough to lower the dielectric constant of upper spacer 156*a*.

Figure 2:
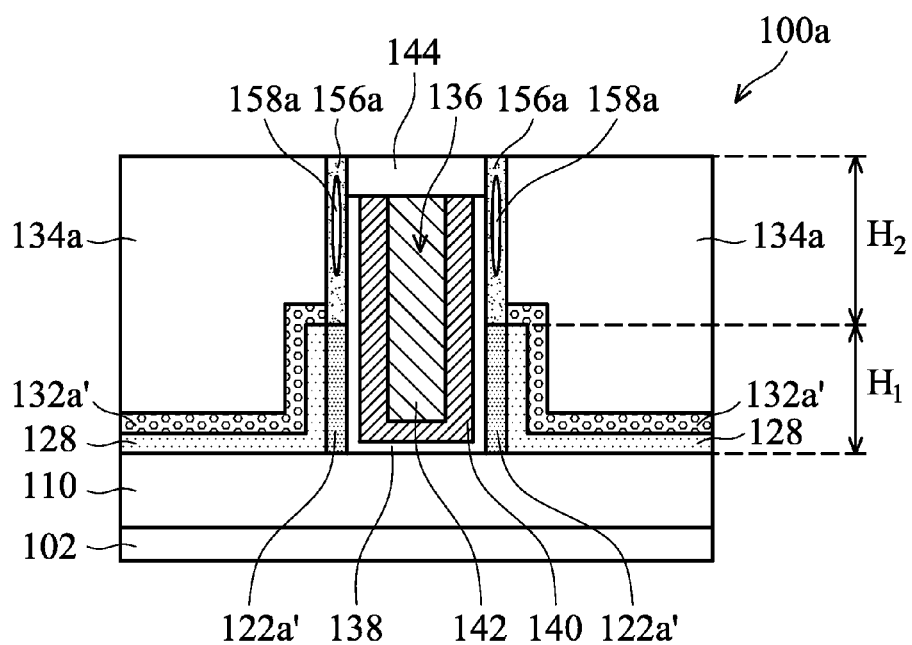
FIG. 2 is a cross-sectional representation of the semiconductor structure shown in FIG. 1Q in accordance with some embodiments.

FIG. 2 is a cross-sectional representation of semiconductor structure 100*a* shown in FIG. 1Q in accordance with some embodiments. As described previously, semiconductor structure 100*a* includes fin structure 108 and gate structure 136 formed across fin structure 108. In addition, bottom spacer 122*a*' is formed on the lower part of the sidewall of gate structure 136, and upper spacer 156*a* is formed on the upper part of the sidewall of gate structure 136. In some embodiments, upper spacer 156*a* is formed by depositing a dielectric material in gap 154*a* and includes air gap 158*a* formed in the dielectric material.

As shown in FIG. 2, upper spacer 156*a* is formed above bottom spacer 122*a*'. In addition, contact etch stop layer 128 is formed on the sidewall of bottom spacer 122*a*' and extends onto the top surface of isolation structure 110 in accordance with some embodiments. Furthermore, etched dummy spacer layer 132*a*' is also located on contact etch stop layer 128 in accordance with some embodiments. In some embodiments, a portion of etched dummy spacer layer 132*e*' is in direct contact with upper spacer 156*a*, as shown in FIG. 2.

Figure 3A:
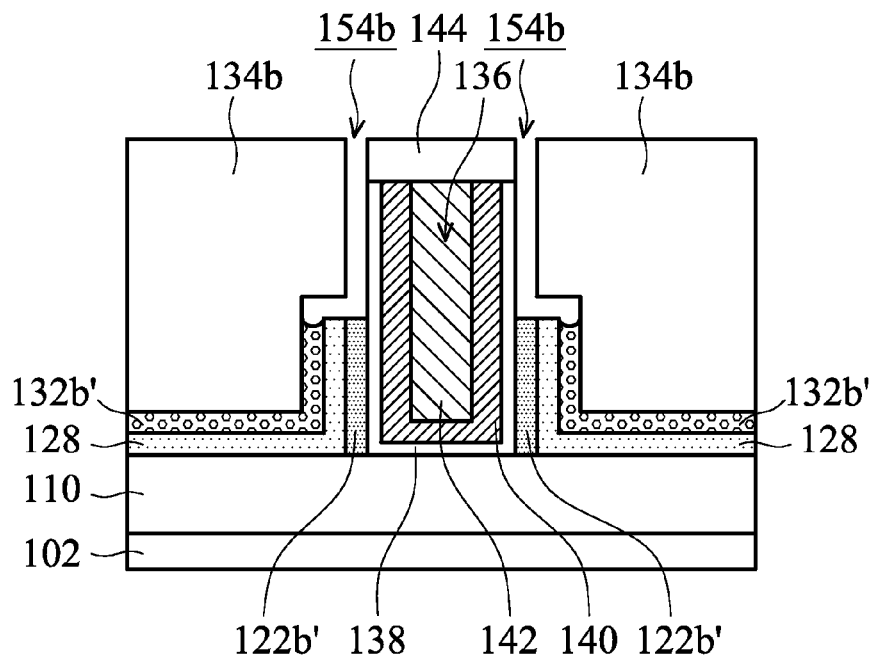
FIGS. 3A and 3B are cross-sectional representations of various stages of forming a semiconductor structure in accordance with some embodiments.
Figure 3B:
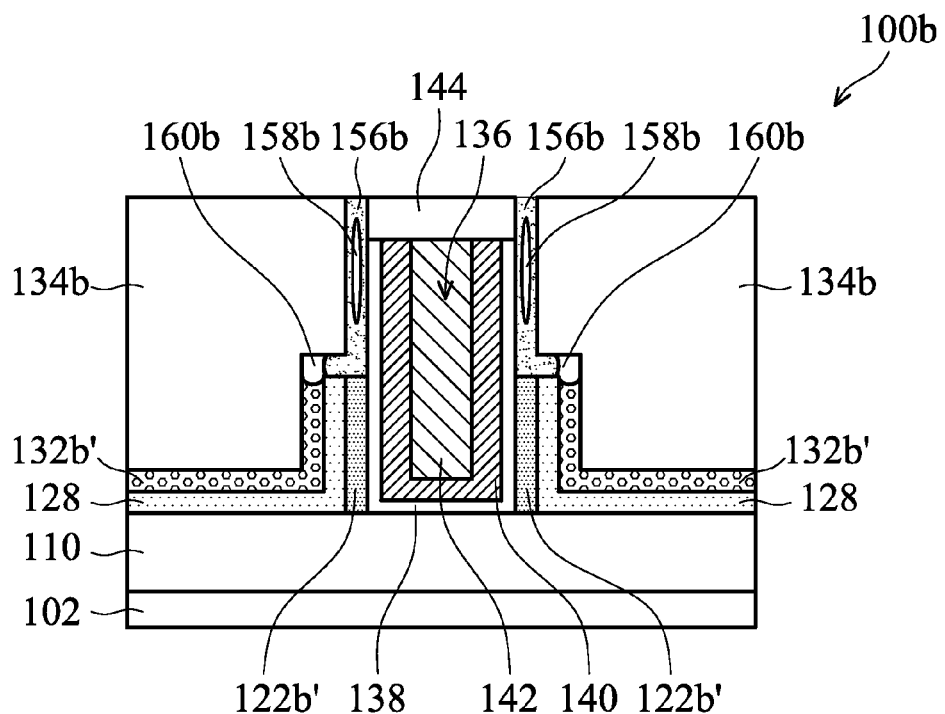

FIGS. 3A and 3B are cross-sectional representations of various stages of forming a semiconductor structure 100*b* in accordance with some embodiments. Some processes and materials used to form semiconductor structure 100*b* may be similar to, or the same as, those used to form semiconductor structure 100*a* as described previously and are not repeated herein.

More specifically, the processes shown in FIGS. 1A to 1O may be performed. Afterwards, a portion of the dummy spacer layer is etched to form a gap 154*b* between an interlayer dielectric layer 134*b* and gate structure 136, and an bottom spacer 122*b*' is exposed by gap 154*b*. In addition, unlike what is shown in FIG. 1P, gap 154*b* further extends to a direction that is substantially perpendicular to the direction of the sidewall of gate structure 136. As shown in FIG. 3A, the top portion of contact etch stop layer 128 is also exposed by gap 154*b* in accordance with some embodiments. In addition, the resulting etched dummy spacer layer 132*b*' does not cover the top portion of contact etch stop layer 128 and bottom spacer 122*b*'.

After gap 154*b* is formed, an upper spacer 156*b* is formed in gap 154*b*, as shown in FIG. 3B in accordance with some embodiments. The formation of upper spacer 156b may be similar to, or the same as, that of upper spacer 156a described previously. In some embodiments, upper spacer 156b includes an air gap 158b formed in a dielectric material.

In addition, as shown in FIG. 3B, gap 154b is not completely filled with upper spacer 156b in accordance with some embodiments. The region of gap 154b not filled with upper spacer 156b forms a second air gap 160b in accordance with some embodiments. As shown in FIG. 3B, second air gap 160b is located at an end of upper spacer 156b. In some embodiments, second air gap 160b is located between one end of upper spacer 156b and one end of etched dummy spacer layer 132b', such that upper spacer 156b and etched dummy spacer layer 132b' are not in direct contact with each other.

Figure 4A:
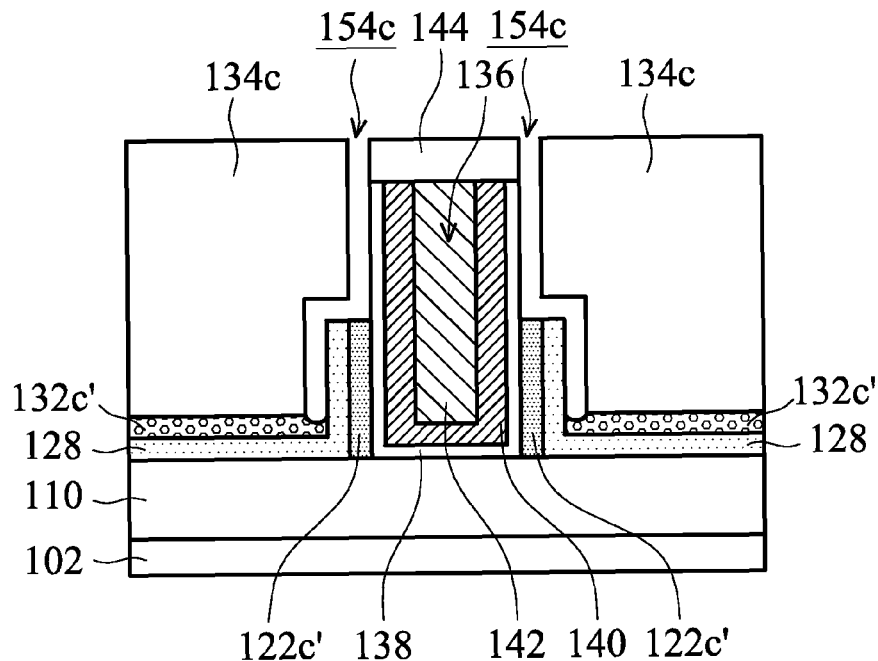
FIGS. 4A and 4B are cross-sectional representations of various stages of forming a semiconductor structure in accordance with some embodiments.
Figure 4B:
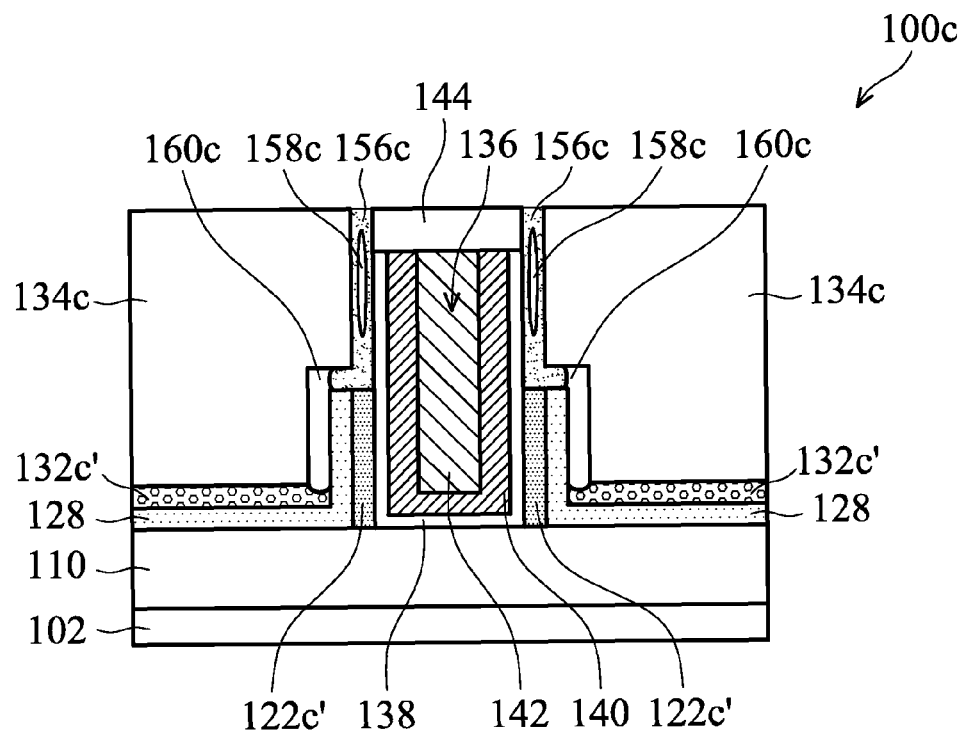

FIGS. 4A and 4B are cross-sectional representations of various stages of forming a semiconductor structure 100c in accordance with some embodiments. Some processes and materials used to form semiconductor structure 100c may be similar to, or the same as, those used to form semiconductor structure 100a as described previously and are not repeated herein.

More specifically, the processes shown in FIGS. 1A to 1O may be performed. Afterwards, a portion of the dummy spacer layer is etched to form a gap 154c between an interlayer dielectric layer 134c and gate structure 136, and an bottom spacer 122c' is exposed by gap 154c. In addition, unlike what is shown is shown in FIG. 1P, gap 154c further extends over a portion of contact etch stop layer 128. As shown in FIG. 4A, the portion of dummy spacer layer formed over the sidewall of contact etch stop layer that is parallel to bottom spacer 122c' is also removed. Accordingly, the resulting etched dummy spacer layer 132c' extends in a direction parallel to the top surface of substrate 102 but does not extend in the direction parallel to the sidewall of bottom spacer 122c'.

As shown in FIG. 4A, gap 154c extends over the top surfaces of bottom spacer 122c' and contact etch stop layer 128 and further extends to the region to between contact etch stop layer 128 and interlayer dielectric layer 134c, such that the top surface of bottom spacer 122c', the top surface of contact etch stop layer 128, and a portion of the sidewall of contact etch stop layer 128 are exposed in gap 154c.

After gap 154c is formed, upper spacer 156c is formed in gap 154c, as shown in FIG. 4B in accordance with some embodiments. The formation of upper spacer 156c may be similar to, or the same as, that of upper spacer 156a described previously. Upper spacer 156c includes an air gap 158c formed in a dielectric material.

In addition, as shown in FIG. 4B, gap 154c is not completely filled with upper spacer 156c in accordance with some embodiments. The region of gap 154c not filled with upper spacer 156c forms a second air gap 160c in accordance with some embodiments. As shown in FIG. 4B, second air gap 160c is located at an end of upper spacer 156c. In some embodiments, second air gap 160c is located between upper spacer 156c and etched dummy spacer layer 132c', such that upper spacer 156c and etched dummy spacer layer 132c' are not in direct contact with each other. In some embodiments, a portion of the sidewall of contact etch stop layer 128 is exposed in second air gap 160c.

Figure 5:
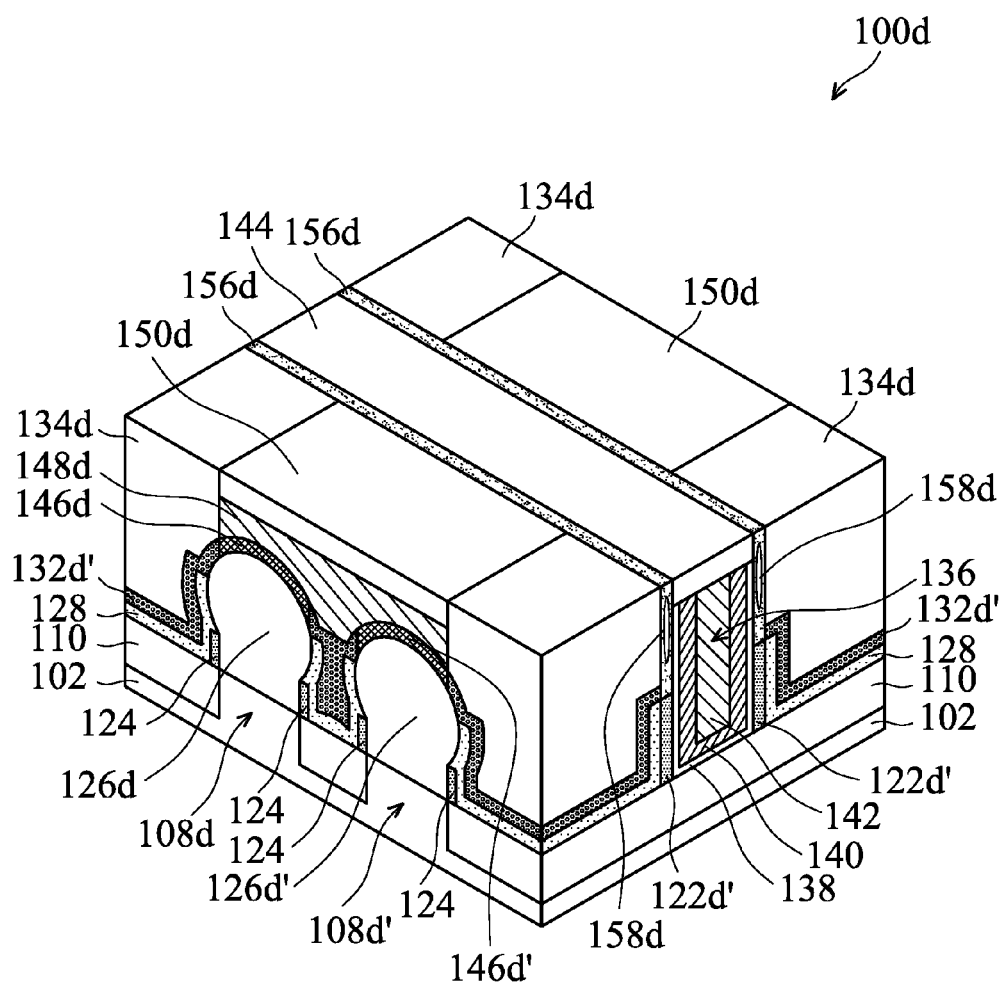
FIG. 5 is a perspective representation of a semiconductor structure in accordance with some embodiments.

FIG. 5 is a perspective representation of a semiconductor structure 100d in accordance with some embodiments. Semiconductor structure 100d is similar with semiconductor structure 100a described previously, except a gate structure is formed across two fin structures and a contact is formed over two source/drain structures formed in the two fin structures. Some processes and materials used to form semiconductor structure 100d are similar to, or the same as, those used to form semiconductor structure 100a described previously and are not repeated herein.

As shown in FIG. 5, semiconductor structure 100d includes a first fin structure 108d and a second fin structure 108d' formed over substrate 102, and gate structure 136 is formed across first fin structure 108d and second fin structure 108d' in accordance with some embodiments. In addition, a first source/drain structure 126d is formed in first fin structure 108d, and a second source/drain structure 126d' is formed in second fin structure 108d'. A first silicide layer 146d is formed over first source/drain structure 126d, and a second silicide layer 116d' is formed over second source/drain structure 126d'. A contact 148d is formed through an interlayer dielectric layer 134d over first silicide layer 146d and second silicide layer 146d'. In addition, contact 148d covers a portion of first source/drain structure 126d and a portion of second source/drain structure 126d', as shown in FIG. 5 in accordance with some embodiments.

Furthermore, a bottom spacer 122d' is formed at the lower part of the sidewall of gate structure 136 and an upper spacer 156d is formed at the upper part of the sidewall of gate structure 136. In addition, upper spacer 156d also includes an air gap 158d formed therein, such that the dielectric constant of upper spacer 156d can be relatively low, and the performance of semiconductor structure 100d can be improved.

FIGS. 6A to 6I are perspective views of various stages of forming a semiconductor structure 100e in accordance with some embodiments. Some processes and materials used to form semiconductor structure 100e may be similar to, or the same as, those used to form semiconductor structure 100a and are not repeated herein.

Figure 6A:
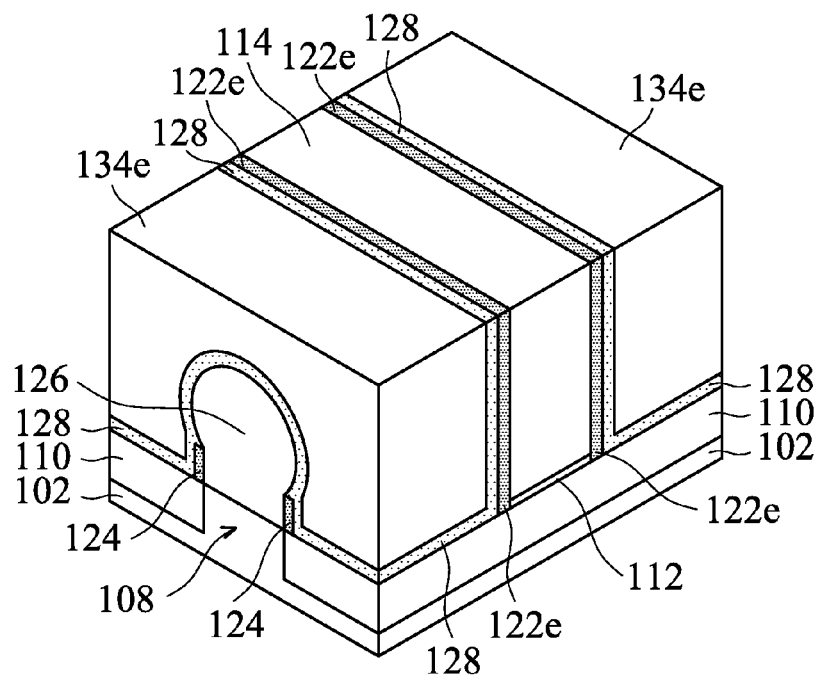
FIGS. 6A to 6I are perspective views of various stages of forming a semiconductor structure in accordance with some embodiments.

More specifically, processes shown in FIGS. 1A to 1H may be performed. After gate spacers 122e and source/drain spacers 124 are formed, contact etch stop layer 128 and an interlayer dielectric layer 134e are formed over substrate 102 in accordance with some embodiments. In addition, a polishing process is performed to expose the top surface of dummy gate structure 114, as shown in FIG. 6A in accordance with some embodiments.

Figure 6B:
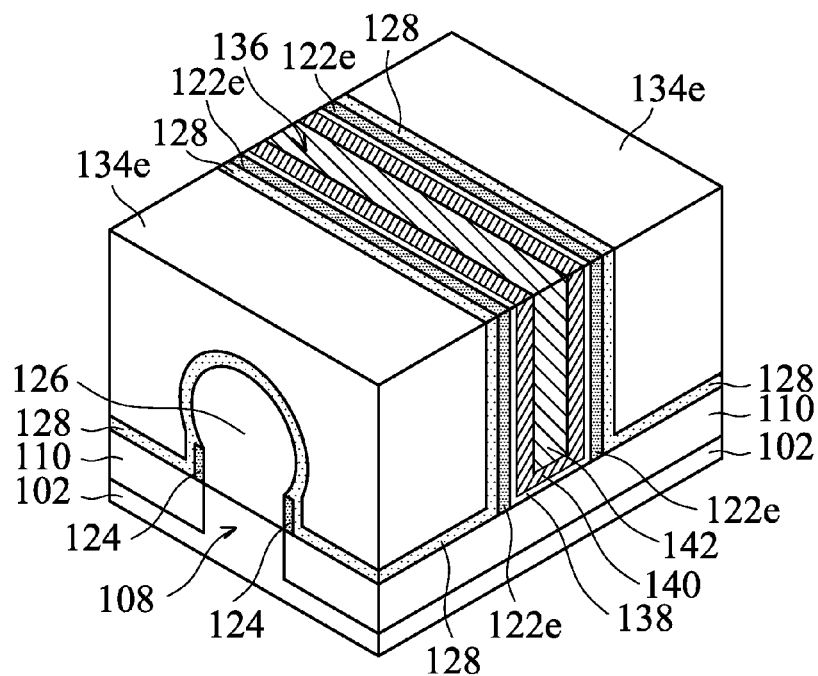
Figure 6C:
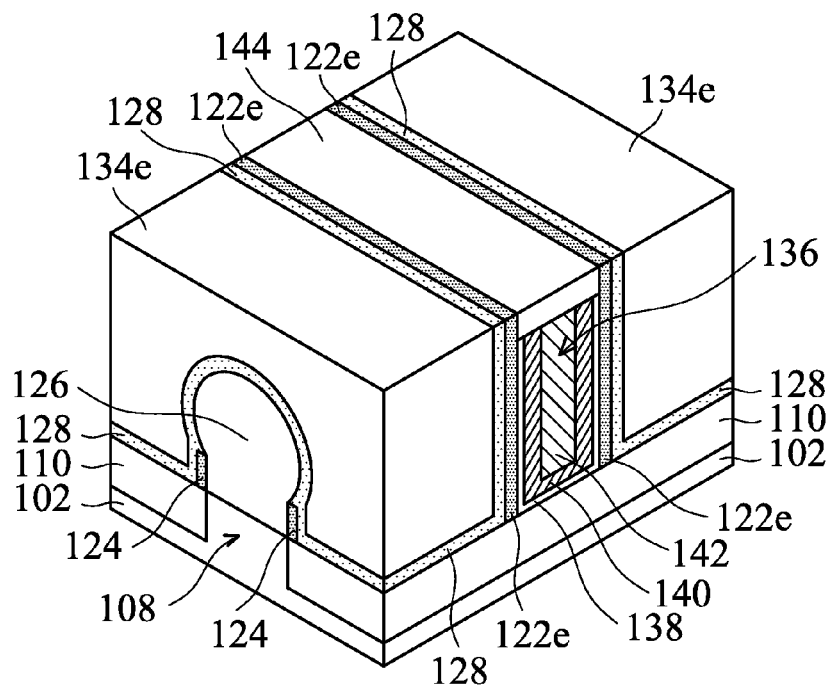

Next, dummy gate structure 114 and gate dielectric layer 112 are replaced by gate structure 136, which includes gate dielectric layer 138, work function metal layer 140, and gate electrode layer 142, as shown in FIG. 6B in accordance with some embodiments. Afterwards, gate structure 136 is etched and gate hard mask layer 144 is formed over gate structure 136, as shown in FIG. 6C in accordance with some embodiments.

Figure 6D:
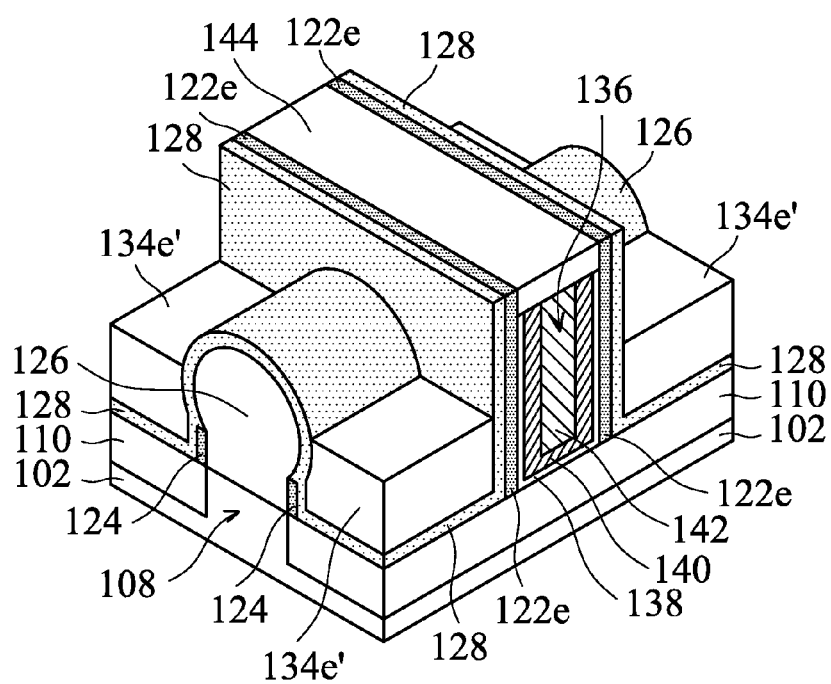
Figure 6E:
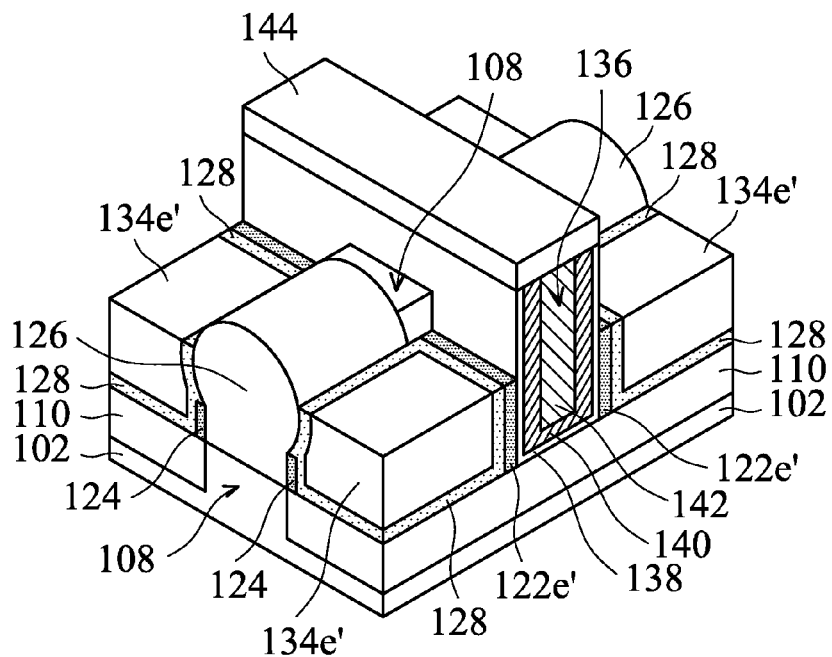

After gate hard mask layer 144 is formed, interlayer dielectric layer 134e is etched back to form a bottom interlayer dielectric layer 134e', as shown in FIG. 6D in accordance with some embodiments. Next, the portions of contact etch stop layer 128 and gate spacers 122e that are not covered by bottom interlayer dielectric layer 134e' are etched, as shown in FIG. 6E in accordance with some embodiments. After the etching process is performed, a bottom spacer 122e' is formed at the lower part of the sidewall of gate structure 136, and contact etch stop layer 128 is positioned over bottom spacers 122e' and extends onto the top surface of isolation structure 110. In some embodiments, the height of bottom spacer 122e' is substantially equal to the height of bottom interlayer dielectric layer 134e'. In addition, as shown in FIG. 6E, since some portions of gate spacer 122e and contact etch stop layer 128 formed over fin structure 108 are removed, a portion of fin structure 108 may be exposed in this stage.

Figure 6F:
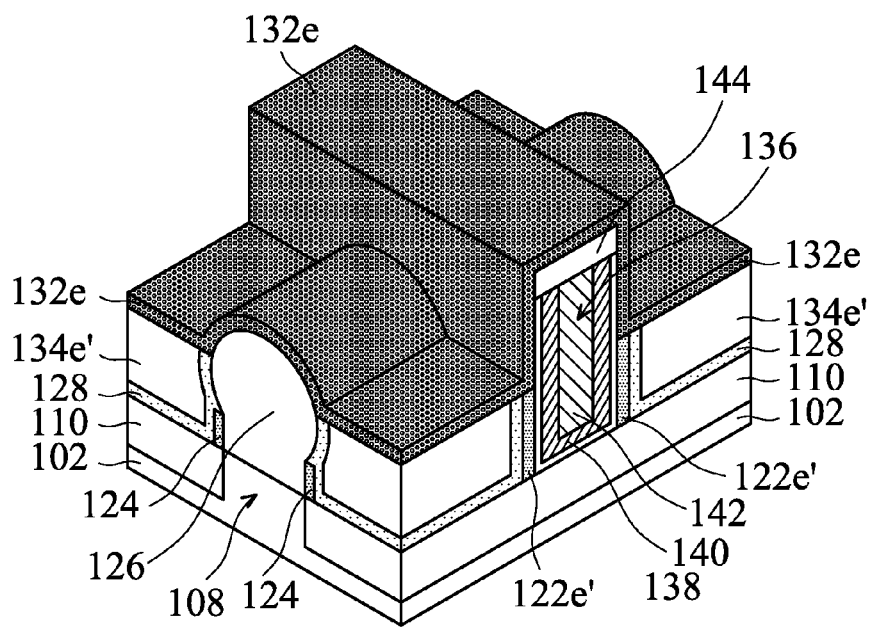
Figure 6G:
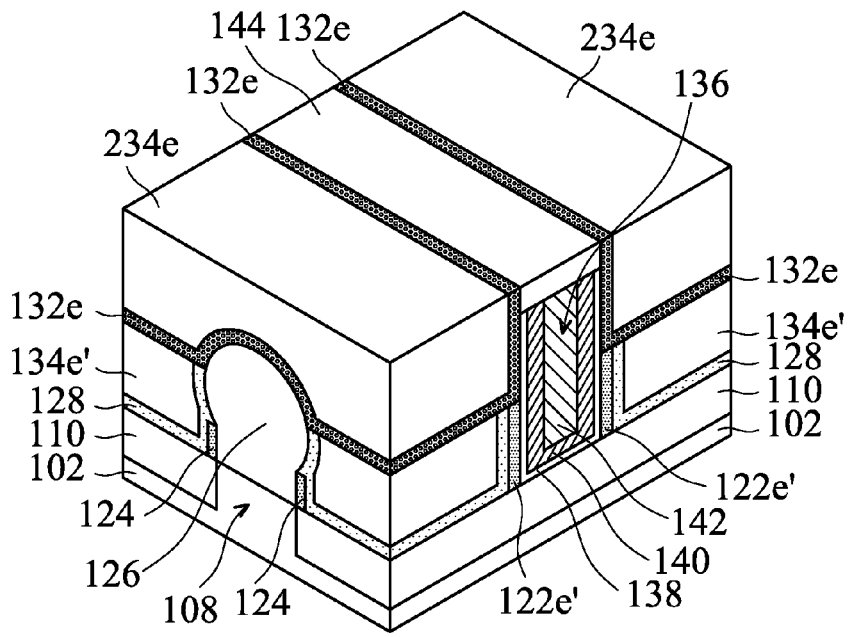

Next, a dummy spacer layer 132e is formed to cover bottom interlayer dielectric layer 134e, source/drain structure 126, and gate structure 136, as shown in FIG. 6F in accordance with some embodiments. As shown in FIG. 6F, dummy spacer layer 132e covers the upper part of the sidewall of gate structure 136. Afterwards, an upper interlayer dielectric layer 234e is formed over dummy spacer layer 132e, and a polishing process is performed until the top surface of gate hard mask layer 144 is exposed, as shown in FIG. 6G in accordance with some embodiments. As shown in FIG. 6G, a portion of dummy spacer layer 132e is positioned between bottom interlayer dielectric layer 134e' and upper interlayer dielectric layer 234d in accordance with some embodiments.

In some embodiments, upper interlayer dielectric layer 234e may include multilayers made of multiple dielectric materials, such as silicon oxide, silicon nitride, silicon oxynitride, and/or other applicable low-k dielectric materials. Upper interlayer dielectric layer 234e may be formed by chemical vapor deposition (CVD), physical vapor deposition, (PVD), atomic layer deposition (ALD), spin-on coating, or other applicable processes.

Figure 6H:
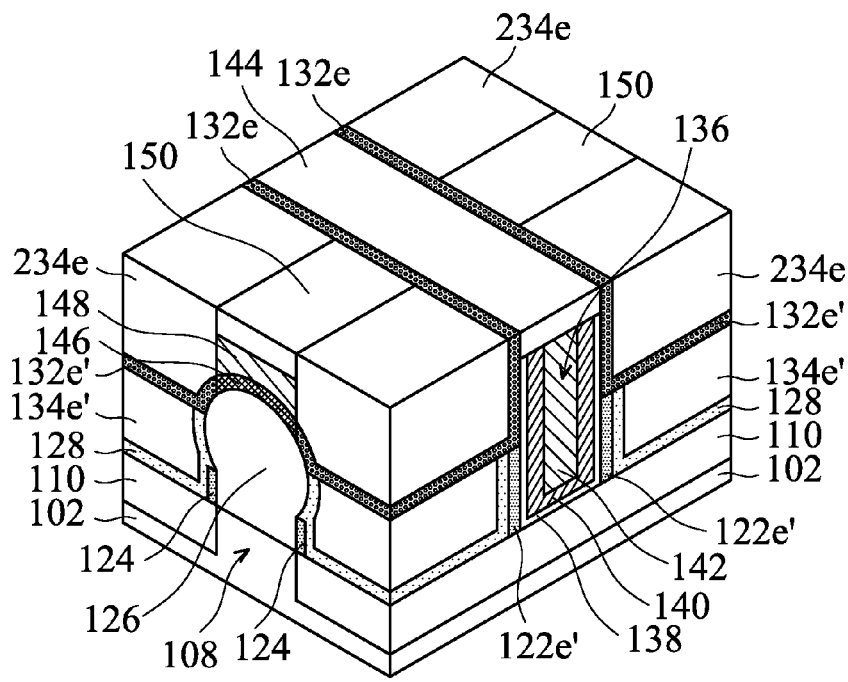

After upper interlayer dielectric layer 234e is formed, processes similar to those shown in FIGS. 1N to 1Q are performed. More specifically, silicide layer 146, contact 148, and contact hard mask layer 150 is formed over source/drain structure 126, as shown in FIG. 6H in accordance with some embodiments. As shown in FIG. 6H, contact 148 is formed through upper interlayer dielectric layer 234e.

Figure 6I:
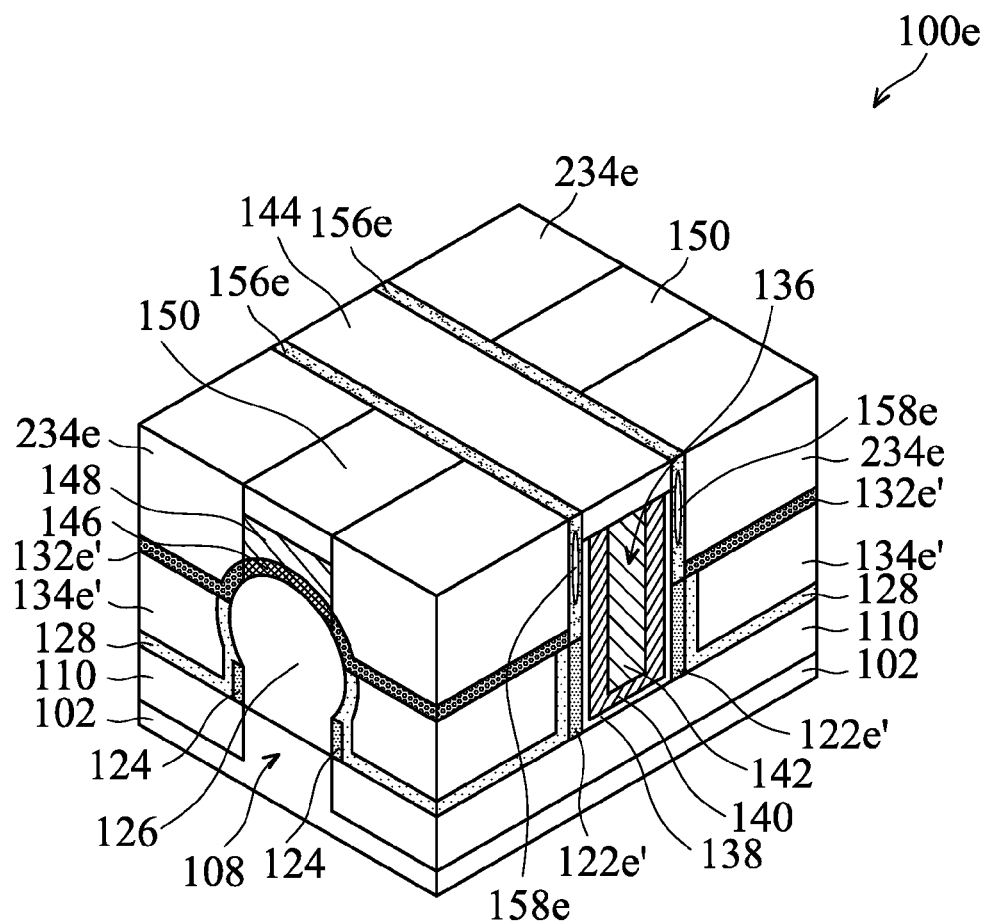

Afterwards, an etching process is performed to form a gap over etched dummy spacer layer 132e', and an upper spacer 156e in formed in the gap, as shown in FIG. 6I in accordance with some embodiments. In some embodiments, upper spacer 156e is formed by depositing a dielectric material in the gap, which is relatively thin, and therefore an air gap 158e is formed in the dielectric material. Upper spacer 156e having air gap 158e can have a relatively low dielectric constant, and therefore the performance of the resulting semiconductor structure 100e may be improved.

Figure 7:
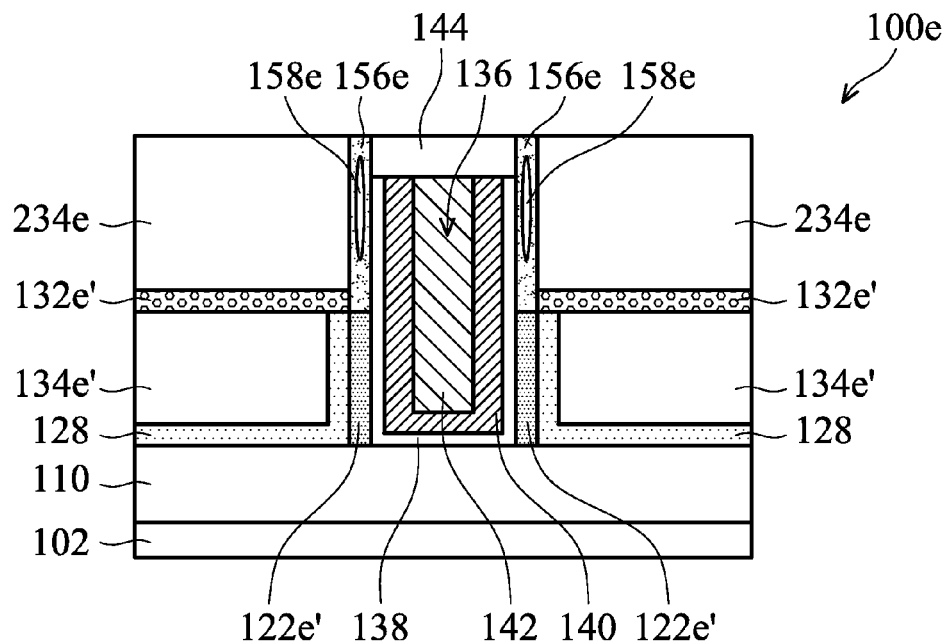
FIG. 7 is a cross-sectional representation of the semiconductor structure shown in FIG. 6I in accordance with some embodiments.

FIG. 7 is a cross-sectional representation of semiconductor structure 100e shown in FIG. 6I in accordance with some embodiments. As described previously, semiconductor structure 100e includes fin structure 108 and gate structure 136 formed across fin structure 108. In addition, bottom spacer 122e' is formed on the lower part of the sidewall of gate structure 136, and upper spacer 156e is formed on the upper part of the sidewall of gate structure 136.

As shown in FIG. 7, the top surface of bottom spacer 122e' is substantially level with the top surface of bottom interlayer dielectric layer 134e'. In some embodiments, bottom interlayer dielectric layer 134e' is formed around bottom spacer 122e', and upper interlayer dielectric layer 234e is formed around upper spacer 156e. In addition, etched dummy spacer layer 132e' is located between bottom interlayer dielectric layer 134e' and upper interlayer dielectric layer 234e. The materials used to form etched dummy spacer layer 132e' may be different from those used to form bottom interlayer dielectric layer 134e' and upper interlayer dielectric layer 234e. In some embodiments, etched dummy spacer layer 132e' is made of a high-k dielectric material, and bottom interlayer dielectric layer 134e' and upper interlayer dielectric layer 234e are made of low-k dielectric materials.

In some embodiments, etched dummy spacer layer 132e' extends in a direction that is substantially perpendicular to the sidewall of gate structure 136, and bottom spacer 122e' and upper spacer 156e are formed on the sidewall of gate structure 136.

Figure 8:
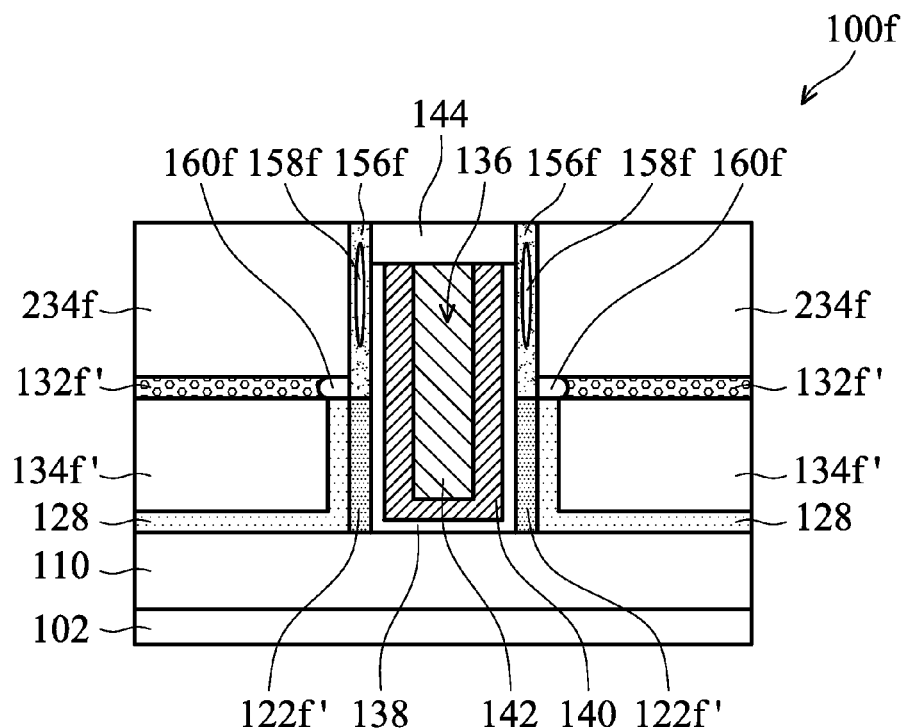
FIG. 8 is a cross-sectional representation of a semiconductor structure in accordance with some embodiments.

FIG. 8 is a cross-sectional representation of a semiconductor structure 100f in accordance with some embodiments. Some processes and materials used to form semiconductor structure 100f may be similar to, or the same as, those used to form semiconductor structure 100e as described previously and are not repeated herein.

More specifically, the processes shown in FIGS. 6A to 6H may be performed. Afterwards, the portion of the dummy spacer layer is formed between gate structure 136 and an upper interlayer dielectric layer 234f and the portion of the dummy spacer layer formed over contact etch stop layer 128 are removed to form a gap. Next, an upper spacer 156f having an air gap 158f is formed in the gap. However, as shown in FIG. 8, the gap is not completely filled with upper spacer 156f in accordance with some embodiments. The region of the gap not filled with upper spacer 156f forms a second air gap 160f in accordance with some embodiments.

As shown in FIG. 8, second air gap 160f is located at an end of etched dummy spacer layer 132f. In some embodiments, second air gap 160f is located between upper spacer 156f and etched dummy spacer layer 132f, such that upper spacer 156f and etched dummy spacer layer 132f are not in direct contact with each other.

Figure 9A:
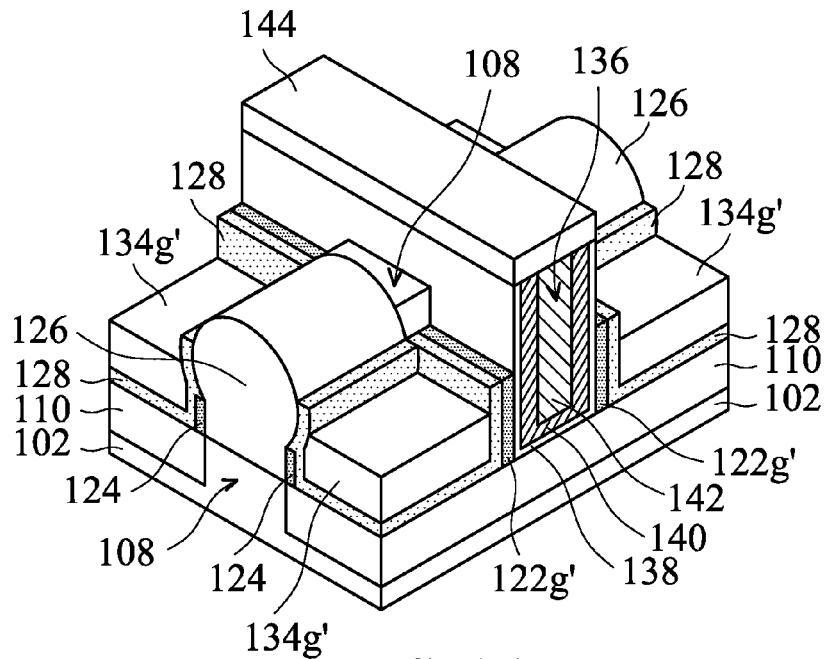
FIGS. 9A to 9B are perspective views of various stages of forming a semiconductor structure in accordance with some embodiments.
Figure 9B:
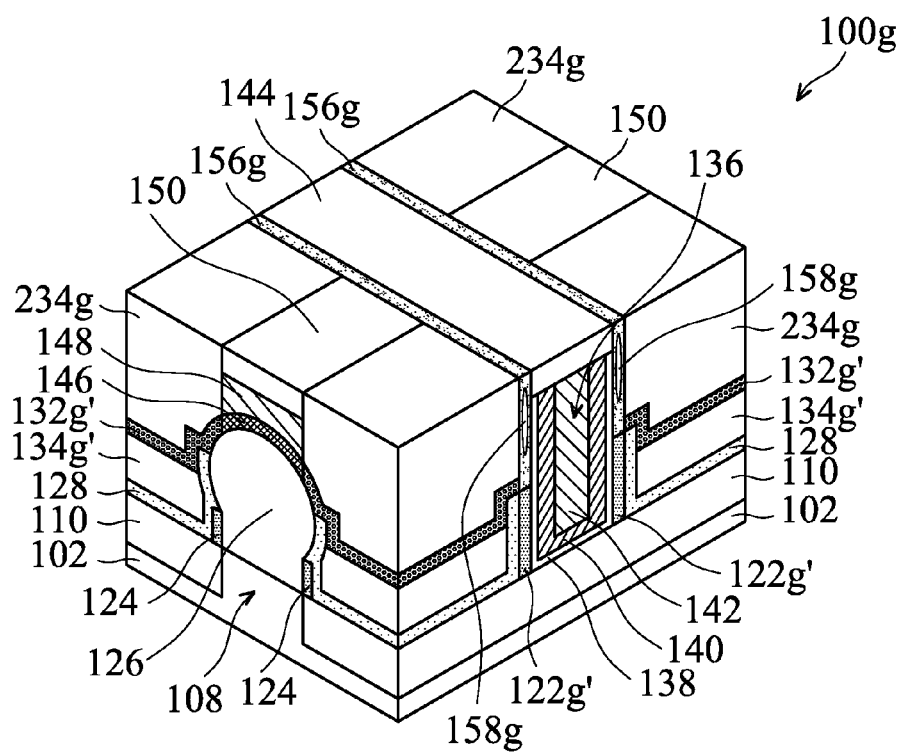

FIGS. 9A to 9B are perspective views of various stages of forming a semiconductor structure 100g in accordance with some embodiments. Some processes and materials used to form semiconductor structure 100g may be similar to, or the same as, those used to form semiconductor structure 100e and are not repeated herein.

More specifically, processes shown in FIGS. 6A to 6D may be performed. Afterwards, the interlayer dielectric layer, the gate spacers, and the contact etch stop layer are etched back, as shown in FIG. 9A in accordance with some embodiments. After the etching process is performed, a bottom spacer 122g' is formed at the lower part of the sidewall of gate structure 136, and contact etch stop layer 128 is positioned over bottom spacers 122g' and, extends onto the top surface of isolation structure 110. In addition, a bottom interlayer dielectric layer 133g' is positioned over substrate 102, and the top surface of bottom spacer 122g' is higher than the top surface of bottom interlayer dielectric layer 134g', as shown in FIG. 9A in accordance with some embodiments.

After bottom spacers 122g' are formed, processes similar to those shown in FIGS. 6F to 6I are performed in accordance with some embodiments. For example, a dummy spacer layer is formed to cover source/drain structure 126 and bottom interlayer dielectric layer 134f'. Afterwards, an upper interlayer dielectric layer 234g is formed over the dummy spacer layer, and silicide layer 146, contact 148, and contact spacer 150 is formed over source/drain structure 126. Next, the portion of the dummy spacer layer formed at the upper part of the sidewall of gate structure 136 is removed to form a gap, and an upper spacer 156g having an air gap 158g therein is formed in the gap, as shown in FIG. 9B in accordance with some embodiments.

Figure 10:
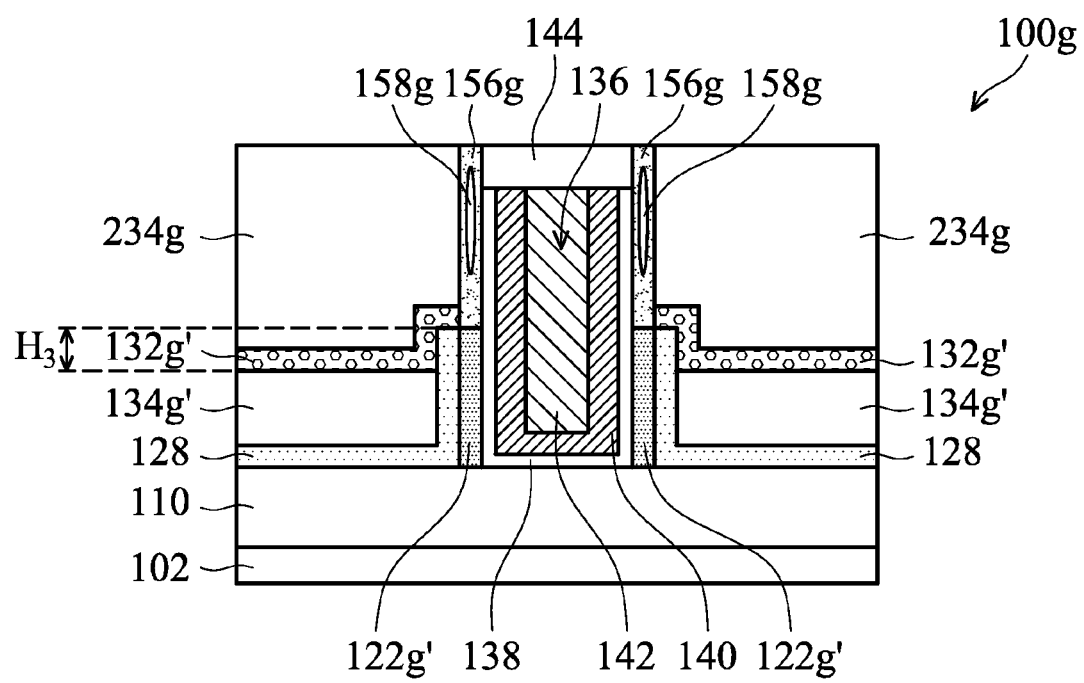
FIG. 10 is a cross-sectional representation of the semiconductor structure shown in FIG. 9B in accordance with some embodiments.

FIG. 10 is a cross-sectional representation of semiconductor structure 100g shown in FIG. 9B in accordance with some embodiments. As described previously, semiconductor structure 100g includes fin structure 108 and gate structure 136 formed across fin structure 108. In addition, bottom spacer 122g' is formed on the lower part of the sidewall of gate structure 136, and upper spacer 156g is formed on the upper part of the sidewall of gate structure 136.

As shown in FIG. 10, the top surface of bottom spacer 122g' is at a position higher than the top surface of bottom interlayer dielectric layer 134g'. In some embodiments, the difference of the height of bottom spacer 122g' and bottom interlayer dielectric layer 134g' is in a range from about 5 nm to about 20 nm. In addition, etched dummy spacer layer 132g' is located on bottom interlayer dielectric layer 134g' and extends over the high part of the sidewall of contact etch stop layer 128, such that etched dummy spacer layer 132g' has a step-like shape. In some embodiments, a portion of etched dummy spacer layer 132g' extends in a direction that is substantially perpendicular to the sidewall of gate structure 136 and another portion of etched dummy spacer layer 132g' extends in a direction that is substantially parallel to the sidewall of gate structure 136.

Figure 11A:
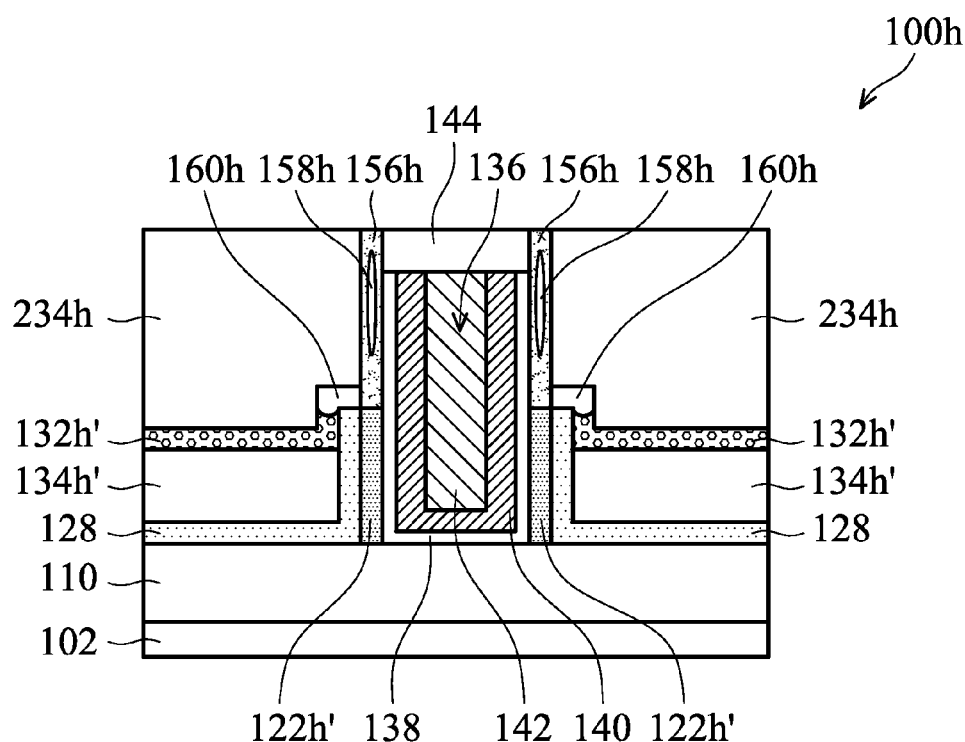
FIGS. 11A and 11B are cross-sectional representations of semiconductor structures in accordance with some embodiments.
Figure 11B:
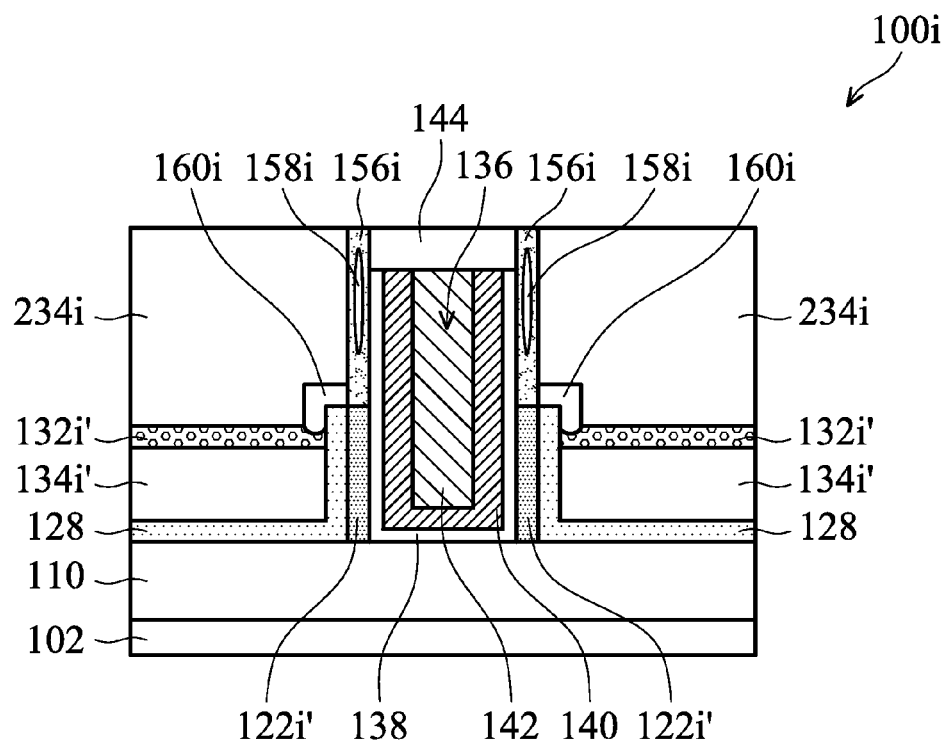

FIGS. 11A and 11B are cross-sectional representations of semiconductor structures 100h and 100i in accordance with some embodiments. Some processes and materials used to form semiconductor structures 100h and 100i may be similar to, or the same as, those used to form semiconductor structure 100g as described previously and are not repeated herein.

Semiconductor structure 100h is substantially the same as semiconductor structure 100g, except a second air gap 160h is formed, as shown in FIG. 11A in accordance with some embodiments. As shown in FIG. 11A, semiconductor structure 100h includes a bottom spacer 122h' formed at the lower part of the sidewall of gate structure 136, and an upper spacer 156g formed at the upper part of the sidewall of gate structure 136. In addition, upper spacer 156g includes an air gap 158g formed inside upper spacer 156g.

Furthermore, contact etch stop layer 128 is formed on the sidewall of bottom spacer 122h' and extends onto isolation structure 110. In addition, the top surfaces of bottom spacer 122g' and contact etch stop layer 128 are substantially level, while the top surface of a bottom interlayer dielectric layer 134h' is at a position that is lower than the top surface of bottom spacer 122g'. An etched dummy spacer layer 132h' is formed between bottom interlayer dielectric layer 134h' and upper interlayer dielectric layer 234h, and upper spacer 156h is located between upper interlayer dielectric layer 234h and the high part of the sidewall of gate structure 136 in accordance with some embodiments.

As shown in FIG. 11A, second air gap 160h is located at an end of etched dummy spacer layer 132h'. In some embodiments, second air gap 160h is located between one end of upper spacer 156h and one end of etched dummy spacer layer 132h', such that upper spacer 156h and etched dummy spacer layer 132h' are not in direct contact with each other.

Semiconductor structure 100i is substantially the same as semiconductor structure 100h, except the portion of the dummy spacer layer formed on the upper part of the sidewall of contact etch stop layer is also removed, as shown in FIG. 11B in accordance with some embodiments. As shown in FIG. 11B, semiconductor structure 100i includes a bottom spacer 122i' formed at the lower part of the sidewall of gate structure 136, and an upper spacer 156i formed at the upper part of the sidewall of gate structure 136. In addition, upper spacer 156i includes an air gap 158i formed inside upper spacer 156i.

Furthermore, contact etch stop layer 128 is formed on the sidewall of bottom spacer 122i' and extends onto isolation structure 110. In addition, the top surfaces of bottom spacer 122i' and contact etch stop layer 128 are substantially level, while the top surface of a bottom interlayer dielectric layer 134i' is lower than the top surface of bottom spacer 122i'. An etched dummy spacer layer 132i' is formed between bottom interlayer dielectric layer 134i' and upper interlayer dielectric layer 234i, and upper spacer 156i is located between upper interlayer dielectric layer 234i and the high part of the sidewall of gate structure 136 in accordance with some embodiments.

As shown in FIG. 11B, a second air gap 160i is located at an end of etched dummy spacer layer 132i'. In some embodiments, second air gap 160i is located between one end of upper spacer 156i and one end of etched dummy spacer layer 132i', such that upper spacer 156i and etched dummy spacer layer 132i' are not in direct contact with each other. In addition, since the portion of the dummy spacer layer formed on the upper part of the sidewall of contact etch stop layer is removed, a corner of contact etch stop layer 128 is exposed in second air gap 160i, as shown in FIG. 11B in accordance with some embodiments.

FIGS. 12A to 12F are perspective views of various stages of forming a semiconductor structure 100j in accordance with some embodiments. The processes and materials used to form semiconductor structure 100j are similar to those used to form semiconductor structure 100e, except dummy gate structure 114 is not replaced by gate structure 136 until both the bottom interlayer dielectric layer and the upper interlayer dielectric layer are formed. The materials and processes which are similar to, or the same as, those described previously are not repeated herein.

Figure 12A:
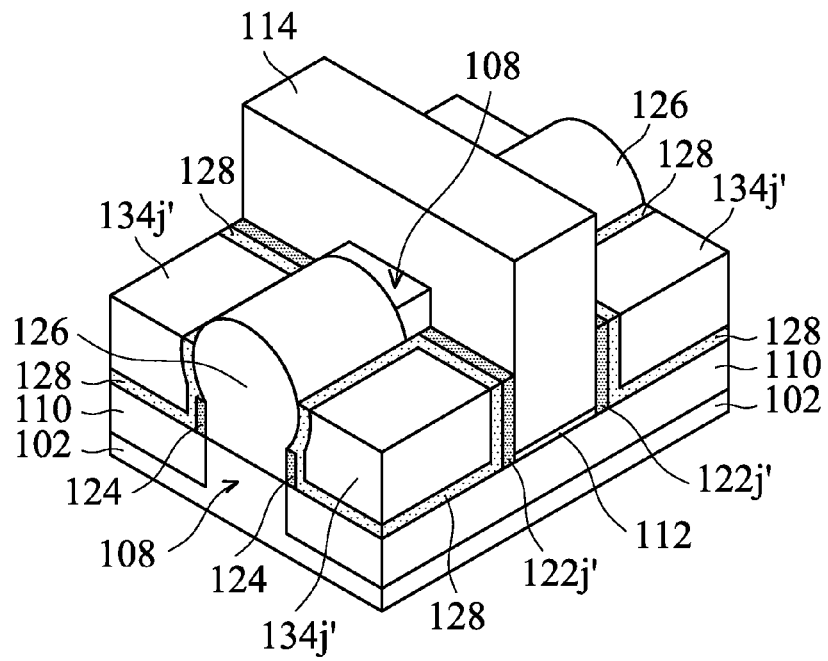
FIGS. 12A to 12F are perspective views of various stages of forming a semiconductor structure in accordance with some embodiments.

As shown in FIG. 12A, fin structure 108 is formed over substrate 102, and isolation structure 110 is formed around fin structure 108. Gate dielectric layer 112 and dummy gate structure 114 is formed across fin structure 108 and extend over isolation structure 110 in accordance with some embodiments. In addition, bottom spacers 122j' are formed at the bottom part of the sidewalls of dummy gate structure 114, and contact etch stop layer 128 is formed on bottom spacers 122j' and extends to the top surface of isolation structure 110. Furthermore, a bottom interlayer dielectric layer 134j' is formed over contact etch stop layer 128 and is substantially level with bottom spacers 122j'.

Figure 12B:
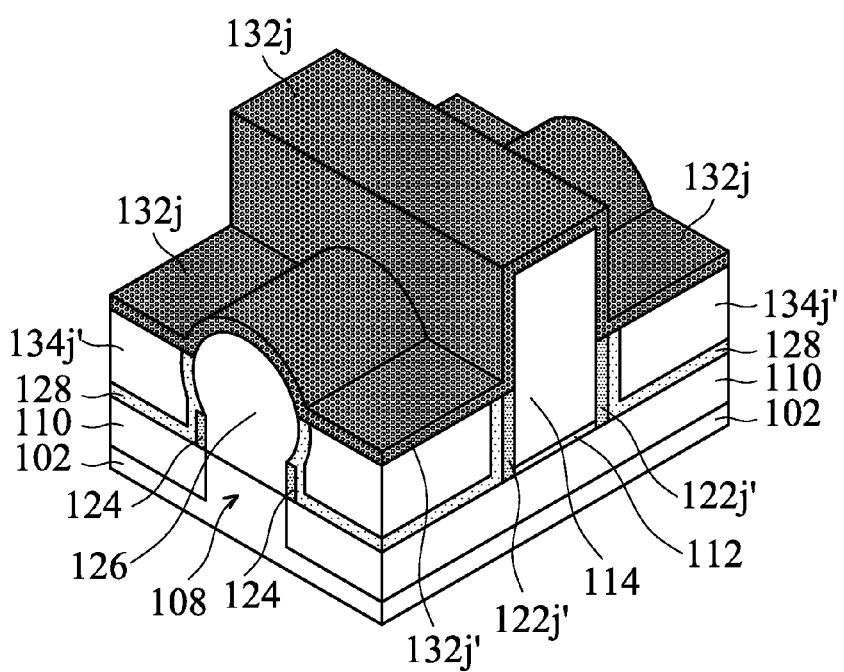
Figure 12C:
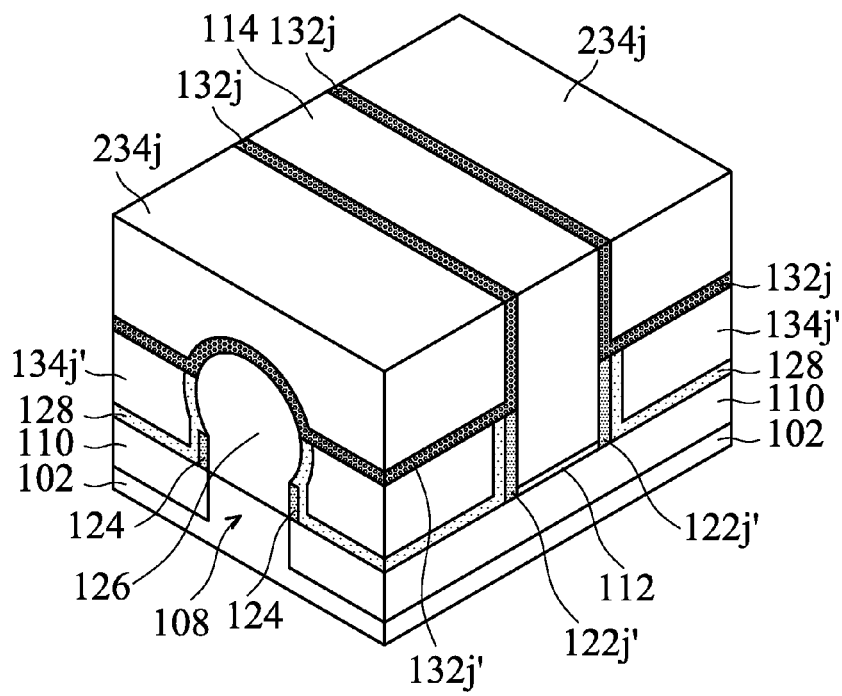

Next, a dummy spacer layer 132j is formed to cover source/drain structure 126, dummy gate structure 114, and bottom interlayer dielectric layer 134j', as shown in FIG. 12B in accordance with some embodiments. Afterwards, an upper interlayer dielectric layer 234j is formed over dummy spacer layer 132j, and a polishing process is performed until the top surface of dummy gate structure 114 is exposed, as shown in FIG. 12C in accordance with some embodiments. As shown in FIG. 12C, a portion of dummy spacer layer 132j is positioned between bottom interlayer dielectric layer 134j' and upper interlayer dielectric layer 234j in accordance with some embodiments.

Figure 12D:
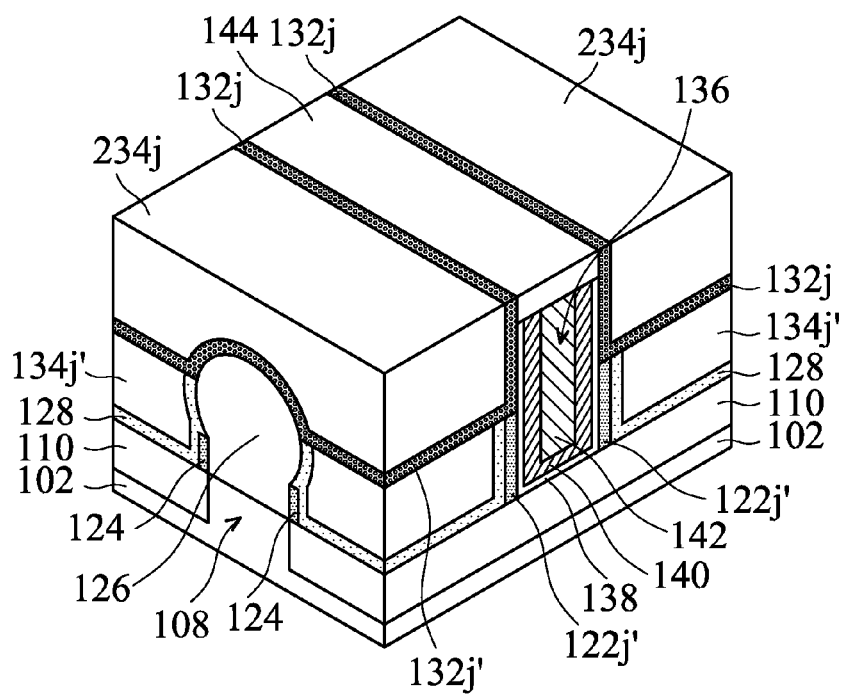

After upper interlayer dielectric layer 234j is formed, dummy gate structure 114 is replaced by gate structure 136, as shown in FIG. 12D in accordance with some embodiments. In some embodiments, gate structure 136 includes gate dielectric layer 138, work function metal layer 140, and gate electrode layer 142. In addition, gate hard mask layer 144 is formed over gate structure 136.

Figure 12E:
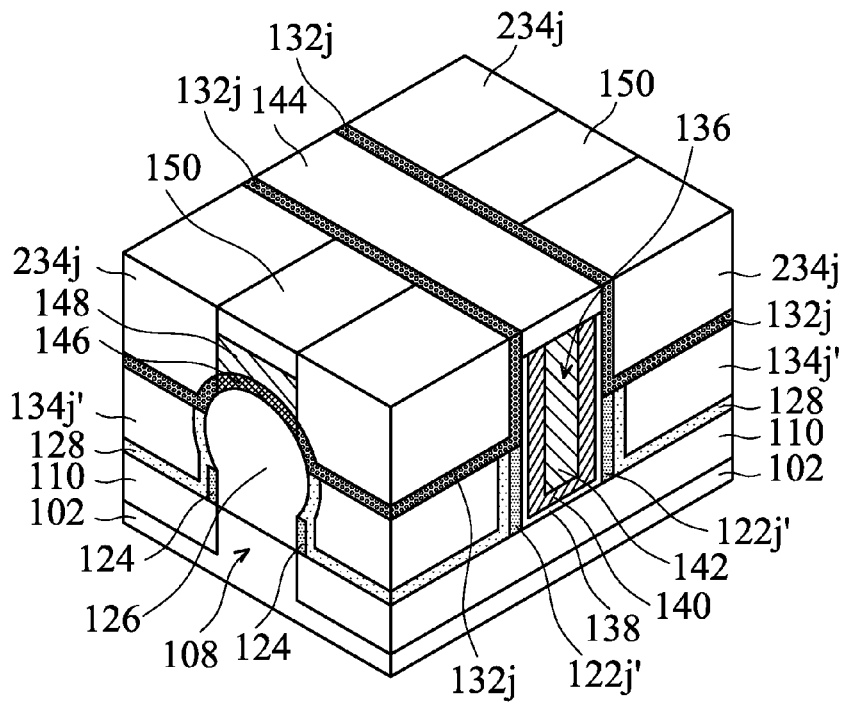

After gate structure 136 is formed, processes similar to those shown in FIGS. 1N to 1Q are performed. More specifically, silicide layer 146, contact 148, and contact hard mask layer 150 is formed over source/drain structure 126, as shown in FIG. 12E in accordance with some embodiments. As shown in FIG. 12E, contact 148 is formed through upper interlayer dielectric layer 234j.

Figure 12F:
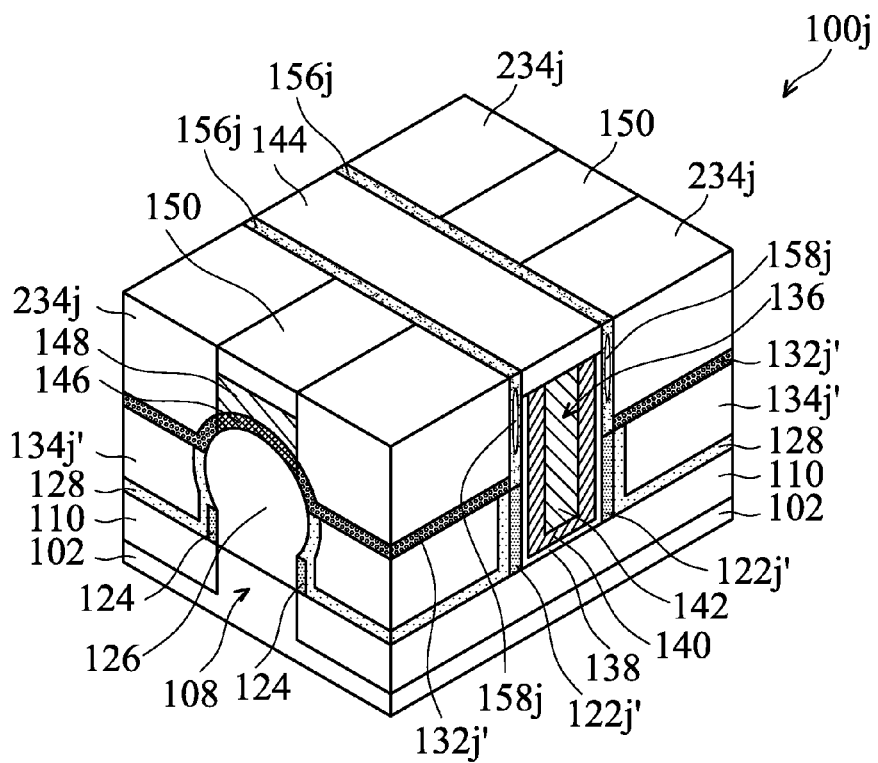

Afterwards, an etching process is performed to form a gap, and an upper spacer 156j in formed in the gap, as shown in FIG. 12F in accordance with some embodiments. As shown in FIG. 12F, after the etching process is performed, an etched dummy spacer layer 132f' remains locating on contact etch stop layer 128. In some embodiments, upper spacer 156f is formed by depositing a dielectric material in the gap, which is relatively thin, and therefore an air gap 158f is formed in the dielectric material. Upper spacer 156f having air gap 158f can have a relatively low dielectric constant, and therefore the performance of the resulting semiconductor structure 100f may be improved.

The cross-sectional representation of semiconductor structure 100j may be similar to, or the same as, that shown in FIG. 7 or 8, and therefore the detail description are not repeated herein. In addition, processes similar to FIGS. 9A to 9B may be performed. That is, in some embodiments, the top surface of bottom interlayer dielectric layer 134j may be lower than the top surface of bottom spacer 122j'.

Generally, parasitic capacitance plays an important role in semiconductor's performance, especially as the size of semiconductor structures shrink. Therefore, in some embodiments of the disclosure, semiconductor structures (e.g. semiconductor structures 100a to 100j) including low-k spacer are formed to reduce the parasitic capacitance of the semiconductor structures, and therefore the performance can be improved.

More specifically, an bottom spacer (e.g. bottom spacers 122a' to 122j') is formed at the bottom part of the sidewall of gate structure 136, and an upper spacer (e.g. upper spacers 156a to 156j) is formed at the upper part of the sidewall of gate structure. In addition, the upper spacer includes air gap (e.g. air gaps 158a to 158j) which has a low dielectric constant, and therefore the upper spacer may have a relatively low dielectric constant.

As described previously, the upper spacer is formed by forming a dummy spacer layer (e.g. dummy spacer layers 132a to 132j) on the upper part of the sidewall of the gate structure 136, removing some portion of the dummy spacer layer to form a gap, and forming the upper spacer in the gap. Therefore, the height of the upper spacer (e.g. height $H_2$) can be controlled by adjusting the height of the bottom spacer (e.g. height $H_1$). That is, the dielectric constant of the upper spacer may be adjusted accordingly.

However, the height of the bottom spacer should not be too small, or there may be too much dummy spacer layer formed on the sidewall of gate structure 136, and it may be difficult to completely remove the dummy spacer layer formed on the sidewall of gate structure 136. Since dummy spacer layer may be made of high-k dielectric layer, the performance of the resulting semiconductor structure may be undermined. On the other hand, if the height of the bottom spacer is too large, the air gap may not be formed in the upper spacer or the air gap formed in the upper spacer may not be large enough.

That is, the bottom spacer can be used to control the height of the upper spacer and to protect the bottom part of the sidewall of gate structure 136. As described previously, the height of the bottom spacer may be controlled by forming a bottom anti-reflective coating layer (e.g. bottom anti-reflective coating layer 130) or forming a bottom interlayer dielectric (e.g. bottom interlayer dielectric layers 134e' to 134f') in accordance with some embodiments. Accordingly, the semiconductor structure including multi-spacer structures, such as the bottom spacer and the upper spacer, can have a low parasitic capacitance and the performance of the semiconductor structure can therefore be improved.

Embodiments of a semiconductor structure and a method for forming the same are provided. The semiconductor structure includes a gate structure formed over a substrate. A bottom spacer is formed at the bottom part of the sidewall of the gate structure, and an upper spacer is formed at the upper part of the sidewall of the gate structure. In addition, the upper spacer includes an air gap formed therein, so that the upper spacer can have a low dielectric constant and the performance of the semiconductor structure can be improved.

In some embodiments, a semiconductor structure is provided. The semiconductor structure includes a fin structure formed over a substrate and a gate structure formed across the fin structure. The semiconductor structure further includes a bottom spacer formed on a lower part of a sidewall of the gate structure and an upper spacer formed on an upper part of the sidewall of the gate structure. In addition, the upper spacer includes an air gap formed in a dielectric material.

In some embodiments, a semiconductor structure is provided. The semiconductor structure includes a fin structure formed over a substrate and a gate structure formed across the fin structure. The semiconductor structure further includes a bottom spacer formed on a lower part of a sidewall of the gate structure and a source/drain structure formed in the fin structure. The semiconductor structure further includes a contact formed over the source/drain structure and an upper spacer formed between the contact and an upper part of the sidewall of the gate structure. In addition, the upper spacer includes an air gap formed in a dielectric material.

In some embodiments, a method for manufacturing a semiconductor structure is provided. The method for manufacturing a semiconductor structure includes forming a fin structure over a substrate and forming a gate structure across the fin structure. The method for manufacturing a semiconductor structure further includes forming a bottom spacer over a lower part of a sidewall of the gate structure and forming a dummy spacer layer over an upper part of the sidewall of the gate structure. The method for manufacturing a semiconductor structure further includes removing at least a portion the dummy spacer layer to form a gap exposing the upper part of the sidewall of the gate structure and forming an upper spacer in the gap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a fin structure formed over a substrate;
   a gate structure formed across the fin structure;
   a bottom spacer formed on a lower part of a sidewall of the gate structure;
   an upper spacer formed on an upper part of the sidewall of the gate structure, wherein the upper spacer comprises a first air gap formed in a dielectric material; and
   a second air gap located adjacent to the upper spacer and separating from the bottom spacer, wherein a bottommost portion of the second air gap is at a position higher than a bottom surface of the gate structure.

2. The semiconductor structure as claimed in claim 1, further comprising:
a bottom interlayer dielectric layer formed around the bottom spacer;
an upper interlayer dielectric layer formed around the upper spacer; and
a spacer layer located between the bottom interlayer dielectric layer and the upper interlayer dielectric layer,
wherein a dielectric constant of the spacer layer is higher than a dielectric constant of the bottom interlayer dielectric layer.

3. The semiconductor structure as claimed in claim 2, wherein the second air gap is located between the spacer layer and the upper spacer.

4. The semiconductor structure as claimed in claim 2, wherein a top surface of the bottom interlayer dielectric layer is at a position that is lower than a top surface of the bottom spacer.

5. The semiconductor structure as claimed in claim 2, wherein the spacer layer and the bottom spacer are made of different materials.

6. The semiconductor structure as claimed in claim 2, wherein the spacer layer is made of aluminum oxide ($Al_2O_3$) or aluminum oxynitride (AlON).

7. A semiconductor structure, comprising:
a fin structure formed over a substrate;
a gate structure formed across the fin structure;
a bottom spacer formed on a lower part of a sidewall of the gate structure;
a source/drain structure forming in the fin structure;
a bottom interlayer dielectric layer formed around the source/drain structure;
a spacer layer formed over the bottom interlayer dielectric layer, wherein the spacer layer and the bottom interlayer dielectric layer are made of different materials;
an upper interlayer dielectric layer formed over the spacer layer, wherein the spacer layer and the upper interlayer dielectric layer are made of different materials;
a contact formed through the upper interlayer dielectric layer over the source/drain structure; and
an upper spacer formed between the contact and an upper part of the sidewall of the gate structure,
wherein the upper spacer comprises an air gap formed in a dielectric material, and a top surface of the bottom interlayer dielectric layer is lower than a top surface of the bottom spacer.

8. The semiconductor structure as claimed in claim 7, further comprising:
a second air gap located at an end of the spacer layer.

9. The semiconductor structure as claimed in claim 7, wherein the spacer layer and the bottom spacer are made of different materials.

10. A semiconductor structure, comprising:
a gate structure over a substrate;
a bottom spacer formed at a lower part of a sidewall of the gate structure;
a bottom interlayer dielectric layer formed around the bottom spacer;
a spacer layer formed over the bottom interlayer dielectric layer, wherein the spacer layer and the bottom spacer are made of different materials;
an upper spacer formed over the bottom spacer, wherein the upper spacer comprises a first air gap formed in a dielectric material, and the upper spacer is thicker than the bottom spacer; and
a second air gap formed over the spacer layer and exposing a portion of the upper spacer.

11. The semiconductor structure as claimed in claim 10, further comprising:
an upper interlayer dielectric layer formed over the spacer layer, wherein the spacer layer and the upper interlayer dielectric layer are made of different materials.

12. The semiconductor structure as claimed in claim 11, wherein the second air gap separates the spacer layer and the upper spacer.

13. The semiconductor structure as claimed in claim 10, wherein the spacer layer is made of aluminum oxide ($Al_2O_3$) or aluminum oxynitride (AlON).

14. The semiconductor structure as claimed in claim 10, wherein the bottom spacer has a height in a range from about 20 nm to about 60 nm.

15. The semiconductor structure as claimed in claim 2, wherein the dielectric constant of the spacer layer is higher than a dielectric constant of the upper interlayer dielectric layer.

16. The semiconductor structure as claimed in claim 7, wherein the spacer layer is in direct contact with the upper spacer.

17. The semiconductor structure as claimed in claim 8, wherein the spacer layer and the upper spacer are separated by the second air gap.

18. The semiconductor structure as claimed in claim 10, wherein the spacer layer extends in a direction substantially parallel with a top surface of the substrate.

19. The semiconductor structure as claimed in claim 1, wherein the second air gap is located outside a space defined by an outer surface of the bottom spacer.

20. The semiconductor structure as claimed in claim 1, wherein the second air gap is located outside a space defined by an outer surface of the upper spacer.

* * * * *